United States Patent
Tomeba

(10) Patent No.: US 10,975,250 B2
(45) Date of Patent: Apr. 13, 2021

(54) INFRARED SHIELDING COMPOSITION, INFRARED CUT FILTER, AND SOLID-STATE IMAGING DEVICE

(71) Applicant: FUJIFILM Corporation, Tokyo (JP)

(72) Inventor: Hisamitsu Tomeba, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 118 days.

(21) Appl. No.: 15/444,661

(22) Filed: Feb. 28, 2017

(65) Prior Publication Data

US 2017/0166762 A1 Jun. 15, 2017

Related U.S. Application Data

(63) Continuation of application No. PCT/JP2015/073965, filed on Aug. 26, 2015.

(30) Foreign Application Priority Data

Sep. 1, 2014 (JP) .............................. JP2014-177301

(51) Int. Cl.
*G03F 7/004* (2006.01)
*C09D 5/32* (2006.01)
(Continued)

(52) U.S. Cl.
CPC ................. *C09D 5/32* (2013.01); *C08F 2/44* (2013.01); *C08F 2/50* (2013.01); *C09D 4/00* (2013.01);
(Continued)

(58) Field of Classification Search
USPC .......................................... 524/431; 428/702
See application file for complete search history.

(56) References Cited

U.S. PATENT DOCUMENTS 8,735,483 B2 * 5/2014 Muro ...................... C08L 35/02
524/406
8,901,225 B2 * 12/2014 Okuda .................... G03F 7/037
524/431

(Continued)

FOREIGN PATENT DOCUMENTS

JP 2007-279676 A 10/2007
JP 2012-506463 A 3/2012
(Continued)

OTHER PUBLICATIONS

International Preliminary Report on Patentability, issued in PCT/JP2015/073965 (PCT/IB/373), dated Mar. 7, 2017.
(Continued)

*Primary Examiner* — Monique R Peets
(74) *Attorney, Agent, or Firm* — Birch, Stewart, Kolasch & Birch, LLP

(57) ABSTRACT

The invention relates to provide an infrared shielding composition that can form an infrared cut filter in which flat coating properties are excellent and the generation of a pattern on the surface is suppressed and that has excellent drying resistance, an infrared cut filter, and a solid-state imaging device. The infrared shielding composition according to the invention includes at least metal containing tungsten oxide particles; a resin binder; a solvent A of which a boiling point is 170° C. to 200° C. at 1 atm; and a solvent B different from the solvent A, in which a content of the solvent A is 0.1 to 20 mass % with respect to a total mass of the infrared shielding composition.

18 Claims, 1 Drawing Sheet

(51) Int. Cl.
*G03F 7/031* (2006.01)
*C08F 2/44* (2006.01)
*H01L 27/14* (2006.01)
*C08F 2/50* (2006.01)
*C09D 4/00* (2006.01)
*G02B 5/22* (2006.01)
*C09D 201/00* (2006.01)
*C09D 7/20* (2018.01)
*G03F 7/038* (2006.01)
*C09D 133/06* (2006.01)
*G03F 7/00* (2006.01)
*G03F 7/027* (2006.01)
*C09D 7/48* (2018.01)
*C09D 133/00* (2006.01)
*C09D 133/10* (2006.01)
*G02B 5/20* (2006.01)
*G03F 7/033* (2006.01)
*G03F 7/16* (2006.01)
*G03F 7/20* (2006.01)
*G03F 7/32* (2006.01)
*G03F 7/40* (2006.01)
*H01L 27/146* (2006.01)
*C08K 5/06* (2006.01)
*C08K 5/10* (2006.01)
*C08K 3/22* (2006.01)

(52) U.S. Cl.
CPC ............... *C09D 7/20* (2018.01); *C09D 7/48* (2018.01); *C09D 133/00* (2013.01); *C09D 133/06* (2013.01); *C09D 133/10* (2013.01); *C09D 201/00* (2013.01); *G02B 5/208* (2013.01); *G02B 5/22* (2013.01); *G03F 7/0007* (2013.01); *G03F 7/0047* (2013.01); *G03F 7/0048* (2013.01); *G03F 7/027* (2013.01); *G03F 7/031* (2013.01); *G03F 7/033* (2013.01); *G03F 7/0388* (2013.01); *G03F 7/16* (2013.01); *G03F 7/168* (2013.01); *G03F 7/20* (2013.01); *G03F 7/322* (2013.01); *G03F 7/40* (2013.01); *H01L 27/14* (2013.01); *H01L 27/14621* (2013.01); *H01L 27/14623* (2013.01); *C08K 5/06* (2013.01); *C08K 5/10* (2013.01); *C08K 2003/2258* (2013.01)

(56) References Cited

U.S. PATENT DOCUMENTS

| | | | |
|---|---|---|---|
| 2012/0129090 A1* | 5/2012 | Mamak | C09C 1/00 430/108.6 |
| 2012/0244473 A1 | 9/2012 | Okuda et al. | |
| 2013/0072615 A1 | 3/2013 | Muro et al. | |
| 2013/0101867 A1* | 4/2013 | Yukinobu | C03C 17/006 428/702 |

FOREIGN PATENT DOCUMENTS

| | | |
|---|---|---|
| JP | 2012-122045 A | 6/2012 |
| TW | 201239520 A1 | 10/2012 |
| WO | WO 2011/067998 A1 | 9/2011 |

OTHER PUBLICATIONS

International Search Report, issued in PCT/JP2015/073965 (PCT/ISA/210), dated Nov. 24, 2015.
Written Opinion of the International Searching Authority, issued in PCT/JP2015/073965 (PCT/ISA/237), dated Nov. 24, 2015.
Japanese Office Action and English translation, dated Oct. 3, 2017, for Japanese Application No. 2016-546580.
Taiwanese Office Action and Search Report for Taiwanese Application No. 104128238, dated Jan. 10, 2019, with partial English translation.
Taiwanese Office Action and Search Report, dated Sep. 10, 2019, for Taiwanese Application No. 104128238, with an English translation.

* cited by examiner

INFRARED SHIELDING COMPOSITION, INFRARED CUT FILTER, AND SOLID-STATE IMAGING DEVICE

CROSS-REFERENCE TO RELATED APPLICATIONS

This application is a Continuation of PCT International Application No. PCT/JP2015/073965 filed on Aug. 26, 2015, which claims priority under 35 U.S.C. § 119(a) to Japanese Patent Application No. 2014-177301 filed on Sep. 1, 2014. The above application is hereby expressly incorporated by reference, in its entirety, into the present application.

BACKGROUND OF THE INVENTION

1. Field of the Invention

The invention relates to an infrared shielding composition, an infrared cut filter, and a solid-state imaging device.

2. Description of the Related Art

In a video camera, a digital still camera, or a cellular phone with a camera function, a charge coupled device (CCD) or a complementary metal-oxide-semiconductor (CMOS) which is a solid-state imaging device for a color image is used. In such a solid-state imaging device, a silicon photodiode having sensitivity to an infrared ray (infrared light) in a light receiving section thereof is used. Therefore, visibility correction is required and infrared cut filters are used in many cases.

For example, in WO2011/067998A, as a composition for forming an infrared cut filter, a photosensitive resin composition including predetermined tungsten oxide and/or composite tungsten oxide is disclosed. Particularly, with respect to an example section of WO2011/067998A, as a solvent included in a photosensitive resin composition, diacetone alcohol, γ-butyrolactone, or the like is used.

SUMMARY OF THE INVENTION

When an infrared cut filter is disposed in a solid-state imaging device, it is desired that the infrared cut filter is disposed at a location having fine level difference in some cases. In this case, it is required that a formed infrared cut filter is applied flat regardless of the fine level difference. The flat application means that a surface of the coated film disposed on the fine level difference becomes flat.

The present inventors attempted to manufacture an infrared cut filter in a portion in which there is fine level difference by using a composition (a composition in which diacetone alcohol (boiling point: 168° C.) is used as a solvent) specifically used in WO2011/067998A, but flat coating properties of the obtained infrared cut filter was not sufficient, and further improvement was required.

It was checked that, if the composition is preserved for a certain period of time, a solid body is attached to a wall of a container in which a composition is put in some cases. It was estimated that a solid content is generated by volatilization of the solvent, and if such a solid content is included in the composition, there is a concern that a defect may be generated in the formed infrared cut filter.

It was checked that when a composition (composition in which γ-butyrolactone (boiling point: 204° C.) was used as a solvent) specifically disclosed in WO2011/067998A was used, an annular (ring-shaped) pattern is generated on the surface of the formed infrared cut filter. If such a pattern is formed, there is a concern that the pattern is erroneously recognized as a defect at the time of surface inspection, and thus the pattern is not desirable. If a pattern is generated on a surface of an infrared cut filter and a defect is generated in the surface inspection, it is referred that surface shape characteristics are bad.

In view of the above, an object of the invention is to provide an infrared shielding composition that can form an infrared cut filter in which flat coating properties are excellent and the generation of a pattern on the surface is suppressed and that has excellent drying resistance.

An object of the invention is to provide an infrared cut filter that is formed by using an infrared shielding composition and a solid-state imaging device including an infrared cut filter.

The present inventors diligently conducted research on the problems in the related art and found that the objects can be achieved by using a solvent having a specific boiling point.

That is, the objects can be achieved by the following configurations.

(1) An infrared shielding composition, comprising at least: metal containing tungsten oxide particles; a resin binder; a solvent A of which a boiling point is 170° C. to 200° C. at 1 atm; and a solvent B different from the solvent A, in which a content of the solvent A is 0.1 to 20 mass % with respect to a total mass of the infrared shielding composition.

(2) The infrared shielding composition according to (1), in which a boiling point of the solvent A is 180° C. to 193° C.

(3) The infrared shielding composition according to (1) or (2), in which the solvent A includes three or more oxygen atoms in a molecule.

(4) The infrared shielding composition according to any one of (1) to (3), in which the solvent A includes dipropylene glycol monomethyl ether.

(5) The infrared shielding composition according to any one of (1) to (4), in which the solvent B includes at least one selected from the group consisting of a solvent B1 of which a boiling point is 100° C. to 130° C. at 1 atm, and a solvent B2 of which a boiling point is greater than 130° C. and less than 170° C. at 1 atm.

(6) The infrared shielding composition according to (5), in which the solvent B includes both of the solvent B1 and the solvent B2.

(7) The infrared shielding composition according to (6), in which a mass ratio of the solvent B1 and the solvent B2 is 0.010 to 0.200, and the mass ratio is represents a mass of a solvent B1/a mass of a solvent B2.

(8) The infrared shielding composition according to any one of (5) to (7), in which a boiling point of the solvent B1 is 120° C. to 130° C. at 1 atm.

(9) The infrared shielding composition according to any one of (5) to (8), the solvent B1 includes butyl acetate.

(10) The infrared shielding composition according to any one of (1) to (9), in which a content of the solvent A is 0.7 to 5.0 mass % with respect to a total mass of the infrared shielding composition.

(11) The infrared shielding composition according to any one of (1) to (10), further comprising: at least one selected from the group consisting of a polymerizable compound, a polymerization initiator, a surfactant, and an ultraviolet absorbing agent.

(12) The infrared shielding composition according to (11), in which the polymerization initiator includes an oxime compound or an α-amino ketone compound.

(13) The infrared shielding composition according to any one of (1) to (12), in which the resin binder includes an alkali-soluble binder.

(14) The infrared shielding composition according to (13), in which the alkali-soluble binder has an acid group.

(15) The infrared shielding composition according to (13) or (14), in which the alkali-soluble binder has a polymerizable group.

(16) The infrared shielding composition according to (11), further comprising: the surfactant, in which a content of the surfactant is 0.001 to 0.070 mass % with respect to a total mass of the infrared shielding composition.

(17) An infrared cut filter formed by using the infrared shielding composition according to any one of (1) to (16).

(18) The infrared cut filter according to (17), in which maximum transmittance at 400 nm to 1,300 nm is 60% or greater, and maximum transmittance at 900 to 1,300 nm is 20% or less.

(19) A solid-state imaging device comprising: the infrared cut filter according to (17) or (18).

(20) A solid-state imaging device, comprising: a filter layer including at least one selected from the group consisting of a color filter transmitting light in a red wavelength range, a color filter transmitting light in a green wavelength range, a color filter transmitting light in a blue wavelength range; and a color filter transmitting infrared light; and the infrared cut filter according to (17) or (18) disposed on a light incident side of the filter layer.

According to the invention, it is possible to provide an infrared shielding composition that can form an infrared cut filter in which flat coating properties are excellent and the generation of a pattern on the surface is suppressed and that has excellent drying resistance.

According to the invention, it is possible to provide an infrared cut filter that is formed by using an infrared shielding composition and a solid-state imaging device including an infrared cut filter.

DESCRIPTION OF THE PREFERRED EMBODIMENTS

Figure 1:
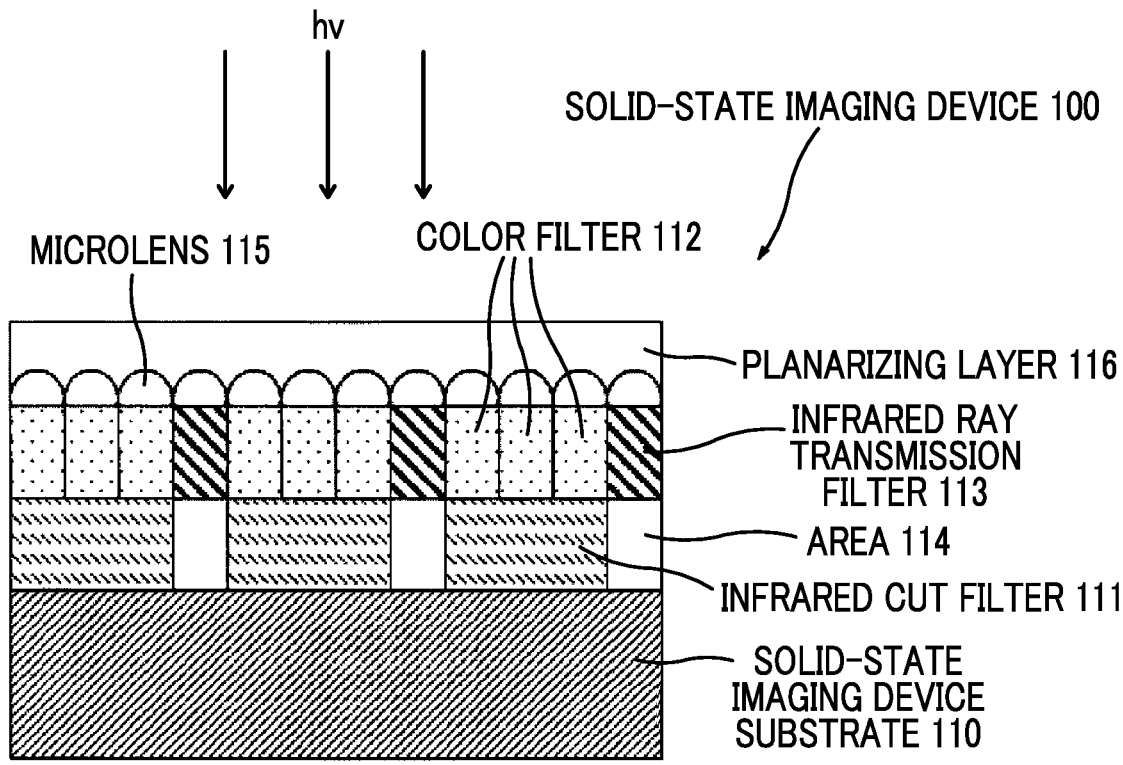
FIG. 1 is a cross-sectional view schematically illustrating a configuration of a solid-state imaging device according to an embodiment of the invention.

Hereinafter, with respect to a suitable form of an infrared shielding composition (a composition for forming an infrared shielding layer), an infrared cut filter, and a solid-state imaging device according to the invention are described.

In the description of a group (atomic group) in this specification, a denotation without substitution and unsubstitution include a group (atomic group) with a substituent, together with a group (atomic group) without a substituent. For example, an "alkyl group" includes not only an alkyl group (unsubstituted alkyl group) without a substituent but also an alkyl group (substituted alkyl group) with a substituent. In this specification, the expression "to" is used as a meaning of including numerical values indicated before and after the expression as a lower limit and an upper limit.

In this specification, "(meth)acrylate" represents acrylate and methacrylate, "(meth)acryl" represents acryl and methacryl, and "(meth)acryloyl" represents acryloyl and methacryloyl.

In this specification, a monomer is differentiated from an oligomer and a polymer, and refers to a compound having a weight-average molecular weight of 2,000 or less.

In this specification, a polymerizable compound refers to a compound having a polymerizable functional group. A polymerizable compound may be a monomer or may be a polymer. The polymerizable functional group refers to a group participating, in polymerization reaction.

In this specification, a total solid content refers to total mass of a content except for a solvent from the entire content of a composition. A solid content according to the invention is a solid content at 25° C.

First, an example of the characteristics of the invention include a fact that a solvent of which a boiling point is 170° C. to 200° C. at 1 atm is used. Specifically, first, if a surface having fine level difference is coated with an infrared shielding composition, the solvent is gradually volatilized. However, if a boiling point of a solvent is caused to be in a specific value or greater, a solvent easily remains even in a final stage of drying, and, as a result, fluidity of a coating matter easily remains. Therefore, an infrared cut filter having excellent flatness of the surface can be easily formed. If the solvent has the boiling point, volatilization from the composition is suppressed, and, as a result, the generation of a dry solid matter or the like is suppressed. The present inventors knew that a boiling point of a solvent influenced as a factor in which a pattern was formed on the surface of the infrared cut filter. That is, the present inventors found that, if a boiling point of a solvent was too high, a pattern as described above is generated, and found that the object of the invention was achieved by using a solvent having a predetermined boiling point or less.

At least metal containing tungsten oxide particles, a resin binder, a solvent A of which a boiling point is 170° C. to 200° C. at 1 atm, or a solvent B different from the solvent A are contained in the infrared shielding composition.

Hereinafter, respective components included in an infrared shielding composition (hereinafter, simply referred to as a "composition") are described below.

(Metal Containing Tungsten Oxide Particles)

Metal containing tungsten oxide particles (hereinafter, also referred to as tungsten oxide fine particles or fine particles) are tungsten oxide particles in which metal atoms are included.

Since these tungsten oxide fine particles selectively shield infrared light (light having a wavelength of about 800 to 1,200 nm) depending on a crystal structure, the tungsten oxide fine particles have effects as an infrared absorbing agent. Accordingly, it is possible to form an infrared cut filter having high light shielding properties in an infrared region and high translucency in a visible light region by causing a filter to contain fine particles. The tungsten oxide fine particles have small absorption even to light having a shorter wavelength than a visible range used in exposure, such as a high-pressure mercury vapor lamp, KrF, and ArF, which are used in image forming. Accordingly, as described below, such a composition has excellent pattern forming properties and can finely control a shape of an infrared cut filter.

Types of the metal atom included in the tungsten oxide fine particles are not particularly limited. However, in view of exhibiting more excellent infrared shielding properties, examples thereof include alkali metal.

The tungsten oxide fine particles are preferably represented by Formula (composition formula) (I) below.

$$M_xW_yO_z \quad (I)$$

M represents alkali metal, W represents tungsten, and O represents oxygen.

0.001≤x/y≤1.1

2.2≤z/y≤3.0

Alkali metal of M may be one type or two or more types.

Alkali metal of M is preferably Rb or Cs and more preferably Cs.

If x/y is 0.001 or greater, infrared light can be sufficiently shielded, and if x/y is 1.1 or less, generation of an impurity phase in tungsten oxide fine particles is more securely avoided.

If z/y is 2.2 or greater, chemical stability as a material can be more improved, and if z/y is 3.0 or less, infrared light can be further shielded.

Specific examples of the tungsten oxide fine particles containing alkali metal represented by Formula (I) above include $Cs_{0.33}WO_3$, $Rb_{0.33}WO_3$, $K_{0.33}WO_3$, preferably $Cs_{0.33}WO_3$ or $Rb_{0.33}WO_3$ and more preferably $Cs_{0.33}WO_3$.

An average particle diameter of the tungsten oxide fine particles is not particularly limited, but preferably 800 nm or less, more preferably 400 nm or less, and even more preferably 200 nm or less. If the average particle diameter is in this range, it is difficult that tungsten oxide fine particles cut off visible light due to light scattering, and thus translucency in a visible light region can be more securely obtained. In view of avoiding light scattering, as an average particle diameter is smaller, the average particle diameter is more preferable. However, for a reason of easy handleability at the time of manufacturing, an average particle diameter of tungsten oxide fine particles is preferably 1 nm or greater.

With respect to a method of measuring an average particle diameter, an average particle diameter is a value obtained by measuring particle diameters (diameters) of at least 50 fine particles with a well-known electron microscope (for example, transmission electron microscope) and arithmetically averaging these particle diameters. In a case where fine particles are not perfect circles, major axes are measured as particle diameters.

The content of the tungsten oxide fine particles in the composition is not particularly limited. However, in view of excellent shielding properties of the infrared light, the content thereof is preferably 1 to 20 mass % and more preferably 3 to 15 mass % with respect to a total mass of the composition.

With respect to the tungsten oxide fine particles, two or more types thereof can be used. In this case, the total content is preferably in the range above.

The tungsten oxide fine particles can be obtained as commercially available products. However, the tungsten oxide fine particles can be obtained by a method of performing a heat treatment on a tungsten compound containing alkali metal under an inert gas atmosphere or a reducing gas atmosphere (see JP4096205B).

The tungsten oxide fine particles can be obtained, for example, as a dispersion of fine particles of tungsten oxide containing alkali metal such as YMF-02A, YMS-01A-2, and YMF-10A-1 manufactured by Sumitomo Metal Mining Co., Ltd.

(Resin Binder)

The resin binder can be appropriately selected depending on purposes. Examples thereof include a (meth)acrylic resin, an urethane resin, polyvinyl alcohol, polyvinyl butyral, polyvinyl formal, polyamide, polyester, polyimide, and polybenzoxazole. A (meth)acrylic resin, an urethane resin, or the like is preferable. A resin binder is preferably an alkali-soluble binder (alkali-soluble resin). If an alkali-soluble binder is contained, in a case where exposure is performed so as to form a pattern on a cured film that can be obtained from the composition, an unexposed portion can be removed with an alkali developer, and thus it is possible to form an excellent pattern with alkali development.

An alkali-soluble binder can be appropriately selected according to the purpose. Examples thereof include a (meth)acrylic resin, an urethane resin, polyvinyl alcohol, polyvinyl butyral, polyvinyl formal, polyamide, polyester, polyimide, and polybenzoxazole, or precursors thereof. A (meth)acrylic resin or an urethane resin is preferable.

As polyamide and polybenzoxazole, or precursors thereof, descriptions of polyamide resins disclosed in sections 0012 to 0046 of WO2011/067998A or paragraphs 0020 to 0054 of JP2013-050593A can be referred to, and the contents thereof are incorporated with this specification.

An alkali-soluble binder preferably has an acid group.

Examples of an acid group include a carboxylic acid group, a sulfonic acid group, a phosphonic acid group, a phosphoric acid group, and a sulfonamide group. However, in view of raw material availability, a carboxylic acid group is preferable.

A type of an alkali-soluble binder having an acid group is not particularly limited. A monomer component is preferably a polymer obtained by using a polymerizable compound having an acid group. In view of adjusting an acid value, a monomer component is more preferably a copolymer obtained by copolymerizing a polymerizable compound having an acid group and a polymerizable compound not having an acid group.

A polymerizable compound having an acid group is not particularly limited. The polymerizable compound having an acid group can be appropriately selected according to the purpose. Examples thereof include acrylic acid, methacrylic acid, itaconic acid, crotonic acid, incrotonic acid, maleic acid, and p-carboxyl styrene. Among these, acrylic acid, methacrylic acid, and p-carboxyl styrene are preferable. These can be used singly or two or more types thereof may be used in combination.

A polymerizable compound not having an acid group is not particularly limited. Examples thereof preferably include (meth)acrylic acid ester (alkyl ester, aryl ester, aralkyl ester, and the like).

An alkyl group in an alkyl ester moiety of (meth)acrylic acid ester may have a linear shape or a branched shape. The acryl group is preferably an alkyl group having 1 to 10 carbon atoms and more preferably an alkyl group having 1 to 6 carbon atoms.

An aryl group in aryl ester moiety of (meth)acrylic acid ester is preferably an aryl group having 6 to 14 carbon atoms and more preferably an aryl group having 6 to 10 carbon atoms.

An aralkyl group in an aralkyl ester moiety of (meth)acrylic acid ester is preferably an aralkyl group having 7 to 20 carbon atoms and more preferably an aralkyl group having 7 to 12 carbon atoms.

A molar ratio of a monomer corresponding to a polymerizable compound having an acid group and a monomer corresponding to a polymerizable compound not having an acid group is generally 1:99 to 99:1, preferably 1:99 to 65:35, and more preferably 5:95 to 30:70.

The content of an acid group in an alkali-soluble binder is not particularly limited, but preferably 0.5 meq/g to 4.0 meq/g and more preferably 0.5 meq/g to 3.0 meq/g. If the content is 0.5 meq/g or greater, alkali developability can be sufficiently obtained, and thus excellent pattern can be more securely obtained. If the content is 4.0 meq/g or less, it is possible to securely avoid a concern that strength of an infrared cut filter on which patterns are formed is deteriorated.

It is preferable that an alkali-soluble binder further has a crosslinkable group, and accordingly both of curing properties of an exposed portion and alkali developability of an unexposed portion can be particularly improved. A crosslinkable group is also preferable since a pattern having high durability can be obtained.

Here, a crosslinkable group is a group that crosslinks a resin binder in the course of polymerization reaction that occurs in a coated layer when the coated layer that can be obtained from the composition is exposed or heated. The crosslinkable group is not particularly limited, as long as the crosslinkable group is a group having this function. Examples thereof include a polymerizable group (for example, an ethylenically unsaturated bond group as a functional group that can perform addition polymerization reaction), an amino group, and an epoxy group. The crosslinkable group may be a functional group that can be radical due to light irradiation, and examples of this crosslinkable group include a thiol group and a halogen group. Among these, an ethylenically unsaturated bond group is preferable. As an ethylenically unsaturated bond group, a styryl group, a (meth)acryloyl group, and an allyl group are preferable. In view of compatibility between stability of the crosslinkable group before exposure and strength of an infrared cut filter on which patterns are formed, the crosslinkable group is more preferably a (meth)acryloyl group.

For example, an alkali-soluble binder is preferably hardened by adding free radicals (polymerization initiation radical or growth radical in the course of polymerization of a polymerizable compound) to this crosslinkable group, performing addition polymerization between polymers directly or via a polymerization chain of the polymerizable compound, and forming crosslinks between polymer molecules. Otherwise, an alkali-soluble binder is preferably hardened by extracting atoms (for example, hydrogen atoms on carbon atoms adjacent to functional crosslinking groups) in the polymer from free radicals, generating polymer radicals, bonding the polymer radicals to each other, and forming crosslinks between polymer molecules.

The content of the crosslinkable group in the alkali-soluble binder is not particularly limited. However, the content is preferably 0.5 to 3.0 meq/g, more preferably 1.0 to 3.0 meq/g, and particularly preferably 1.5 to 2.8 meq/g. If the content is 0.5 meq/g or greater, a curing reaction amount is sufficient, and thus high sensitivity can be obtained. If the content is 3.0 meq/g or less, drying resistance of the composition can be increased.

Here, for example, the content (meq/g) can be measured by iodine value titration.

The alkali-soluble binder having a crosslinkable group is disclosed in JP2003-262958A, and the compounds described herein can be used in the invention.

Examples of one of suitable forms of the alkali-soluble binder include a polymer obtained by polymerizing a monomer component including a compound (hereinafter, referred to as "ether dimer") represented by Formula (ED) below. If this polymer is used, pattern forming properties of an infrared cut filter are more excellent.

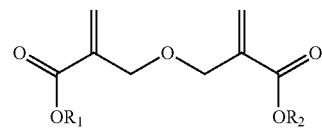

Formula (ED)

In Formula (ED), $R_1$ and $R_2$ each represent a hydrocarbon group having 1 to 25 carbon atoms which may have a hydrogen atom or a substituent.

Examples of the hydrocarbon group having 1 to 25 carbon atoms that may have a substituent represented by $R_1$ and $R_2$ include a linear or branched alkyl group; an aryl group; an alicyclic group; an alkyl group substituted with alkoxy; and an alkyl group substituted with an aryl group such as benzyl. Among these, particularly, a substituent of primary or secondary carbon that is hardly separated due to heat or acid such as a methyl group, an ethyl group, a cyclohexyl group, and a benzyl group is preferable in view of heat resistance.

Specific examples of an ether dimer include specific examples of ether dimer disclosed in paragraph [0565] of JP2012-208494A (corresponding to [0694] of US2012/235099A), and the contents thereof are incorporated in this specification. Among these, particularly, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferable. This ether dimer may be used singly or two or more types thereof may be used in combination. A structural body derived from a compound represented by Formula (ED) may be copolymerized with other monomers.

According to the invention, a constitutional unit derived from ether dimer is preferably 1 to 50 mol % and more preferably 1 to 20 mol % with respect to a total amount.

Together with ether dimer, other monomers may be copolymerized.

Examples of the other monomers that can be copolymerized together with ether dimer include a monomer for introducing an acid group, a monomer for introducing a radically polymerizable double bond, a monomer for introducing an epoxy group, and other monomers that can be copolymerized. These monomers may be used singly or two or more types thereof may be used in combination.

Examples of a monomer for introducing an acid group include a monomer having a carboxyl group such as a (meth)acrylic acid or an itaconic acid, a monomer having a phenolic hydroxyl group such as N-hydroxyphenylmaleimide, and a monomer having a carboxylic anhydride group such as maleic anhydride or itaconic anhydride. Among these, particularly, a (meth)acrylic acid is preferable.

A monomer for introducing an acid group may be a monomer that can provide an acid group after polymerization, and examples thereof include a monomer having a hydroxyl group such as 2-hydroxyethyl (meth)acrylate, a monomer having an epoxy group such as glycidyl (meth)acrylate, and a monomer having an isocyanate group such as 2-isocyanatoethyl (meth)acrylate. In a case where a monomer that can provide an acid group after polymerization is used, it is necessary to perform a treatment of providing an acid group after polymerization. The treatment of providing an acid group after polymerization differs from types of a monomer, and examples thereof include the following treatments. In a case where a monomer having a hydroxyl group is used, examples thereof include a treatment for adding acid anhydride such as succinic anhydride, tetrahydrophthalic anhydride, and maleic acid anhydride. In a case where a monomer having an epoxy group is used, examples thereof include a treatment for adding a compound having an acid group and an amino group such as N-methylaminobenzoic acid, and N-methylamino phenol or a treatment for adding, for example, acid anhydride such as succinic anhydride, tetrahydrophthalic anhydride, and maleic acid anhydride to, for example, a hydroxyl group generated after acid such as (meth)acrylic acid is added. In a case where a monomer having an isocyanate group is used, examples thereof include a treatment for adding a compound having an acid group and a hydroxyl group such as 2-hydroxybutyric acid.

In a case where a polymer obtained by polymerizing a monomer component including a compound represented by Formula (ED) includes a monomer for introducing an acid group, the content thereof is not particularly limited. However, the content is preferably 5 to 70 mass % and more preferably 10 to 60 mass % with respect to a total monomer component.

Examples of the monomer for introducing a radically polymerizable double bond include a monomer having a carboxyl group such as a (meth)acrylic acid and an itaconic acid; a monomer having a carboxylic anhydride group such as maleic anhydride and itaconic anhydride; and a monomer having an epoxy group such as glycidyl (meth)acrylate, 3,4-epoxycyclohexylmethyl (meth)acrylate, o- (otherwise, m- or p-) vinylbenzyl glycidyl ether. In a case where a monomer for introducing a radically polymerizable double bond is used, it is necessary to perform a treatment for providing a radically polymerizable double bond after polymerization. A treatment for providing a radically polymerizable double bond after polymerization differs according to types of monomers used for providing radically polymerizable double bonds, and examples thereof include the following treatments. In a case where the monomer used is a monomer having a carboxyl group such as (meth)acrylic acid and itaconic acid, examples of the treatment include a treatment for adding a compound having an epoxy group such as glycidyl (meth)acrylate, 3,4-epoxycyclohexylmethyl (meth)acrylate, o- (otherwise, m- or p-) vinylbenzyl glycidyl ether and a radically polymerizable double bond. In a case where a monomer having a carboxylic anhydride group such as maleic anhydride and itaconic acid is used, examples of the treatment include a treatment of adding a compound having a hydroxyl group such as 2-hydroxyethyl (meth)acrylate and a radically polymerizable double bond. In a case where a monomer having an epoxy group such as glycidyl (meth)acrylate, 3,4-epoxycyclohexylmethyl (meth)acrylate, o- (otherwise, m- or p-) vinylbenzyl glycidyl ether, examples of a treatment of adding a compound having an acid group such as a (meth)acrylic acid and a radically polymerizable double bond.

In a case where a polymer obtained by polymerizing a monomer component including a compound represented by Formula (ED) includes a monomer for introducing a radically polymerizable double bond, the content thereof is not particularly limited. However, the content is preferably 5 to 70 mass % and more preferably 10 to 60 mass % with respect to the total monomer component.

Examples of the monomer for introducing an epoxy group include glycidyl (meth)acrylate, 3,4-epoxycyclohexylmethyl (meth)acrylate, o- (otherwise, m- or p-) vinylbenzyl glycidyl ether.

In a case where the polymer obtained by polymerizing a monomer component including a compound represented by Formula (ED) includes a monomer for introducing an epoxy group, the content thereof is not particularly limited. However, the content is preferably 5 to 70 mass % and more preferably 10 to 60 mass % with respect to the total monomer component.

Examples of the other copolymerizable monomer include (meth)acrylic acid esters such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, 2-ethylhexyl methyl (meth)acrylate, cyclohexyl (meth)acrylate, benzyl (meth)acrylate, and 2-hydroxyethyl (meth)acrylate; an aromatic vinyl compound such as styrene, vinyl toluene, and α-methylstyrene, N-substituted maleimide such as N-phenylmaleimide and N-cyclohexylmaleimide; butadiene or a substituted butadiene compound such as butadiene and isoprene; ethylene or a substituted ethylene compound such as ethylene, propylene, vinyl chloride, and acrylonitrile; and vinyl ester such as vinyl acetate. Among these, methyl (meth)acrylate, cyclohexyl (meth)acrylate, benzyl (meth)acrylate, and styrene are preferable since transparency is favorable and heat resistance is hardly deteriorated.

In a case where a polymer obtained by polymerizing a monomer component including a compound represented by Formula (ED) includes other copolymerizable monomers, the content thereof is not particularly limited. However, the content is preferably 95 mass % or less and more preferably 85 mass % or less.

A weight-average molecular weight of the polymer obtained by polymerizing a monomer component including a compound represented by Formula (ED) is not particularly limited. However, in view of heat resistance of the coated film formed with the composition, the weight-average molecular weight thereof is preferably 2,000 to 200,000, more preferably 5,000 to 100,000, and even more preferably 5,000 to 20,000.

In a case where the polymer obtained by polymerizing a monomer component including a compound represented by Formula (ED) has an acid group, the acid value is preferably 30 to 500 mgKOH/g and more preferably 50 to 400 mgKOH/g.

The polymer obtained by polymerizing a monomer component including a compound represented by Formula (ED) can be easily obtained by polymerizing a monomer that necessarily includes at least ether dimer. At this point, cyclization reaction of ether dimer together with polymerization proceeds, and a tetrahydropyran ring structure is formed.

A polymerization method applied to synthesis of the polymer obtained by polymerizing a monomer component including a compound represented by Formula (ED) is not particularly limited, and various polymerization methods in the related art can be employed. However, a solution polymerization method is particularly preferable. Specifically, for example, according to the synthesis method of a polymer (a) disclosed in JP2004-300204A, it is possible to synthesize the polymer obtained by polymerizing a monomer component including a compound represented by Formula (ED).

Hereinafter, exemplary compounds of the polymer obtained by polymerizing a monomer component including a compound represented by Formula (ED) are provided, but the invention is not limited thereto. Compositional ratios of exemplary compounds provided below are mol %. Examples of commercially available products include ACRYCURE RD-F8 (acrylic resin) (manufactured by Nippon Shokubai Co., Ltd.).

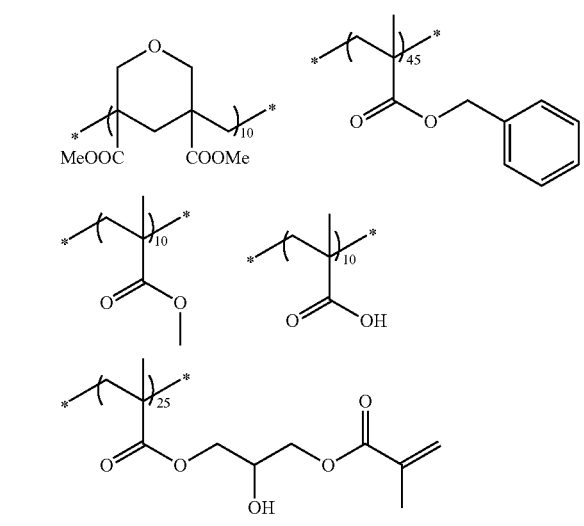

Mw = 12000

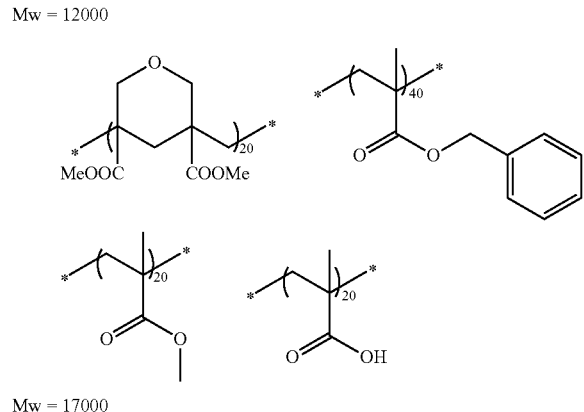

Mw = 17000

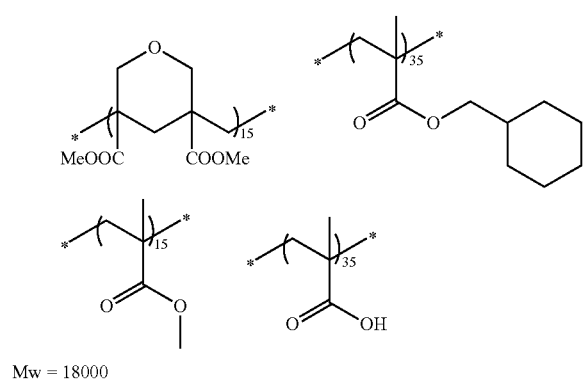

Mw = 18000

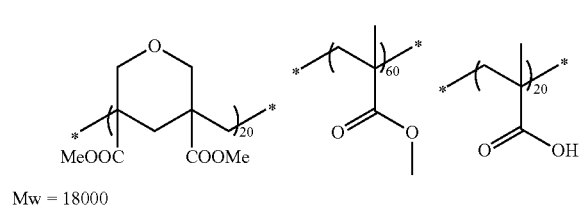

Mw = 18000

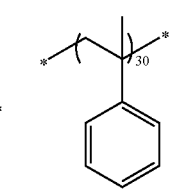

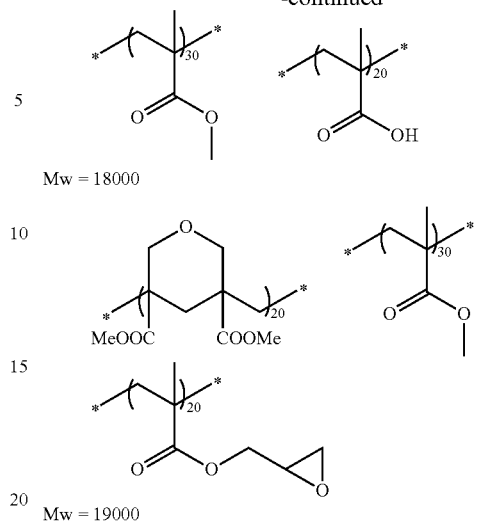

Mw = 18000

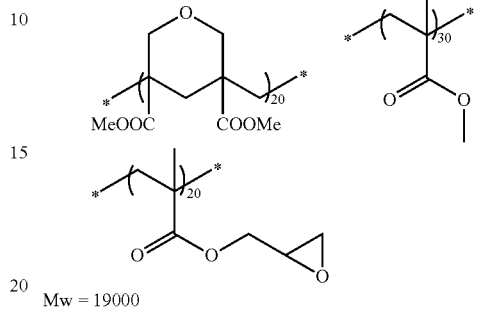

Mw = 19000

A content of a resin binder (particularly, an alkali-soluble binder) in the composition is not particularly limited. However, the strength of an infrared cut filter becomes more excellent. In view of improvement on photolithographic properties and residues, the content is preferably 5 to 50 mass % and more preferably 10 to 25 mass % with respect to the total mass of the composition.

(Solvent A)

A solvent A is a solvent of which a boiling point is 170° C. to 200° C. at 1 atm.

A boiling point of the solvent A is 170° C. to 200° C. Since at least one of flat coating properties of the infrared cut filter, surface characteristics of the infrared cut filter, and drying resistance of the composition is excellent (hereinafter, simply referred to as "since the effect of the invention is more excellent"), the boiling point is preferably 180° C. to 193° C.

In a case where a boiling point of the solvent A is less than 170° C., flat coating properties of the infrared cut filter or the drying resistance of the composition is deteriorated. In a case where a boiling point of the solvent A is greater than 200° C., patterns are easily generated on the surface of the infrared cut filter.

According to one of the suitable form of the solvent A, since the effect of the invention is more excellent, it is preferable to include three or more oxygen atoms in a molecule in the solvent A, it is more preferable to include three to five oxygen atoms, and it is even more preferable to include three oxygen atoms.

Suitable forms of the solvent A include a solvent represented by Formula (X) or (Y) below.

$$R^1O\text{-}(L\text{-}O)_n\text{—}R^2 \qquad \text{Formula (X)}$$

$$R^1O\text{-}(L\text{-}O)_m\text{—}CO\text{—}R^2 \qquad \text{Formula (Y)}$$

In Formulae (X) and (Y), $R^1$ represents a hydrogen atom or an alkyl group. The number of carbon atoms included in the alkyl group is not particularly limited. However, the number of carbon atoms is preferably 1 to 3 and more preferably 1.

$R^2$ represents an alkyl group. The number of carbon atoms included in the alkyl group is not particularly limited. However, the number of carbon atoms is preferably 1 to 3 and more preferably 1.

L represents an alkylene group. The number of carbon atoms included in the alkylene group is not particularly limited. However, the number of carbon atoms is preferably 3 to 5 and more preferably 3.

n represents an integer of 2 to 4.

m represents an integer of 1 or 2.

Specific examples of the solvent A include dipropylene glycol monomethyl ether (boiling point: 188° C.), cyclohexanol acetate (boiling point: 173° C.), dipropylene glycol dimethyl ether (boiling point: 171° C.), ethylene glycol monobutyl ether acetate (boiling point: 192° C.), diethylene glycol diethyl ether (boiling point: 189° C.), diethylene glycol monomethyl ether (boiling point: 194° C.), propylene glycol diacetate (boiling point: 190° C.), 3-methoxy butyl acetate (boiling point: 171° C.), propylene glycol-n-butyl ether (boiling point: 170° C.), diethylene glycol ethyl methyl ether (boiling point: 176° C.), and diethylene glycol isopropyl methyl ether (boiling point: 179° C.).

According to one of suitable forms of the solvent A, a solvent represented by Formula (X) or (Y) in the solvent A is preferably included as a main component. As a main component, a content of a solvent represented by Formula (X) or (Y) is intended to be greater than 50 mass % with respect to a total mass of the solvent A.

According to one of the other suitable forms of the solvent A, it is preferable that a solvent (for example, dipropylene glycol monomethyl ether) provided as specific examples of the solvent A is included in the solvent A as a main component. As a main component, a content of the solvent provided as specific examples of the solvent A is greater than 50 mass % with respect to a total mass of the solvent A.

The content of the solvent A with respect to the total mass of the infrared shielding composition is 0.1 to 20 mass %. Since the effect of the invention is more excellent, the content thereof is preferably 0.3 to 5.0 mass %, more preferably 0.7 to 5.0 mass %, and even more preferably 2.0 to 4.0 mass %.

In a case where a content of the solvent A is less than 0.1 mass %, flat coating properties of the infrared cut filter or drying resistance of the composition is deteriorated. In a case where the content of the solvent A is greater than 20 mass %, patterns described above are easily generated on the surface of the infrared cut filter.

(Solvent B)

A solvent B is a solvent different from the solvent A. If two different solvents of the solvent A and the solvent B are mixed with each other, it is assumed that evenness of the composition increases, and the generation of a cyclic pattern is suppressed. Examples of one of the suitable forms of the solvent B include a form in which a boiling point is less than 170° C. at 1 atm.

Since the effect of the invention is more excellent, examples of the solvent B include the solvent B1 of which a boiling point is 100° C. to 130° C. at 1 atm or the solvent B2 of which a boiling point is greater than 130° C. and less than 170° C. at 1 atm.

A boiling point of the solvent B1 is 100° C. to 130° C. at 1 atm and preferably 120 to 130° C.

A boiling point of the solvent B2 is greater than 130° C. and less than 170° C. at 1 atm and preferably 140° C. to 150° C.

Even in a final condition for drying the composition, it is preferable that fluidity is maintained. Therefore, it is considered that it is preferable the solvents are gradually volatilized rather than the solvents are evenly evaporated near the same temperature. Accordingly, it is preferable that the difference between a boiling point of the solvent A and a boiling point of the solvent B2 is 20° C. or higher. In the same manner, it is preferable that the difference between a boiling point of the solvent B2 and a boiling point of the solvent B1 is 10° C. to 45° C. and more preferably 15° C. to 30° C.

Specific examples of the solvent B1 include butyl acetate (boiling point: 126° C.), ethylene glycol monomethyl ether (boiling point: 125° C.), methyl-n-butyl ketone (boiling point: 127° C.), and tetrahydrofuran (boiling point: 126° C.).

Specific examples of the solvent B2 include propylene glycol 1-monomethyl ether 2-acetate (boiling point: 145° C.), ethylene glycol monomethyl ether acetate (boiling point: 145° C.), ethyl lactate (boiling point: 155° C.), diethylene glycol dimethyl ether (boiling point: 162° C.), 3-methoxy butanol (boiling point: 161° C.), and propylene glycol-n-propyl ether (boiling point: 150° C.).

A content of the solvent B with respect to a total mass of the infrared shielding composition is not particularly limited. However, since the effect of the invention is more excellent, the content thereof is preferably 20 to 90 mass % and more preferably 40 to 70 mass %.

A mass ratio of the solvent A and the solvent B (a mass of the solvent A/a mass of the solvent B) in the infrared shielding composition is not particularly limited. However, since the effect of the invention is more excellent, a mass ratio is preferably 0.005 to 0.500 and more preferably 0.010 to 0.200.

In a case where the solvent B1 is included in the infrared shielding composition, the content of the solvent B1 with respect to the total mass of the infrared shielding composition is not particularly limited. However, since the effect of the invention is more excellent, the content thereof is preferably 0.1 to 10 mass % and more preferably 0.5 to 5.0 mass %.

In a case where the solvent B2 is included in the infrared shielding composition, the content of the solvent B2 with respect to the total mass of the infrared shielding composition is not particularly limited. However, since the effect of the invention is more excellent, the content thereof is preferably 20 to 80 mass % and more preferably 30 to 70 mass %.

The solvent B may be used singly or two or more types thereof may be used in combination. Among these, since the effect of the invention is more excellent, it is preferable that the solvent B1 and the solvent B2 can be used together.

In a case where the solvent B1 and the solvent B2 are used together, a mass ratio of the solvent B1 and the solvent B2 (a mass of the solvent B1/a mass of the solvent B2) is not particularly limited. However, since the effect of the invention is more excellent, a mass ratio thereof is preferably 0.005 to 0.500 and more preferably 0.010 to 0.200.

(Other Components)

Tungsten oxide fine particles, a resin binder, and components other than the solvent A and the solvent B may be included in the composition. Examples thereof include a polymerizable compound, a surfactant, a dispersing agent, a polymerization initiator, a polymerization inhibitor, an ultraviolet absorbing agent, a sensitizer, a crosslinking agent, a curing accelerator, a filler, and an elastomer.

Hereinafter, respective components are described.

(Polymerizable Compound)

As the polymerizable compound, any compounds can be used, as long as the compounds have a polymerizable group (a group that reacts due to at least one of acid, radical, and heat) in a molecule. Preferably, it is preferable that the polymerizable compound is a polyfunctional polymerizable compound having plural polymerizable groups in a molecule.

Examples of a polymerizable compound having a polymerizable functional group that is suitably used and reacts due to at least any one of acid, radical, and heat include an ethylenically unsaturated group containing compound having an ethylenically unsaturated group such as an unsaturated ester functional group, an unsaturated amide group, a vinyl ether group, and an allyl group; a methylol compound, a bismaleimide compound, a benzocyclobutene compound, a bisallylnadiimide compound, and a benzoxazine compound.

Examples of the polymerizable compound generally include a radically polymerizable compound. A compound that is well-known as a compound having an ethylenically unsaturated double bond in an industry sector can be particularly used without limitation.

For example, these compounds have chemical forms of a monomer, a prepolymer, that is, a dimer, a trimer, and an oligomer, or mixtures thereof and copolymers thereof.

Examples of the monomer and the copolymer thereof include unsaturated carboxylic acid (for example, acrylic acid, methacrylic acid, itaconic acid, crotonic acid, isocrotonic acid, and maleic acid), esters thereof, amides thereof, and copolymers thereof. It is preferable that an unsaturated carboxylic acid ester, ester of unsaturated carboxylic acid and an aliphatic polyhydric alcohol compound, and amides of an unsaturated carboxylic acid and an aliphatic polyvalent amine compound are used.

Particularly, ester of an unsaturated carboxylic acid and an aliphatic polyhydric alcohol compound can exhibit high hydrophobicity in an exposed portion. Therefore, ester is preferable since patterns having a desired shape due to alkali development are formed easily and patterns having high durability can be obtained.

Unsaturated carboxylic acid ester or amides having a nucleophilic substituent such as a hydroxyl group, an amino group, and a mercapto group, an addition reaction product with an monofunctional or polyfunctional isocyanates or epoxys, and dehydration condensation reaction products with the unsaturated carboxylic acid ester or amides and monofunctional or polyfunctional carboxylic acid are suitably used.

Addition reaction products with unsaturated carboxylic acid ester or amides having an electrophilic substituent such as an isocyanate group or an epoxy group and monofunctional or polyfunctional alcohols, amines, and thiols and substitution reaction products with unsaturated carboxylic acid ester or amides having a leaving substituent such as a halogen group and a tosyloxy group and monofunctional or polyfunctional alcohols, amines, and thiols are also suitable. As additional examples, instead of the unsaturated carboxylic acid, a compound group substituted with an unsaturated phosphonic acid, styrene, vinyl ether, and the like can be used.

As the unsaturated carboxylic acid ester, methacrylic acid ester is preferable, and examples thereof include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, penta erythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis-[p-(methacryloxyethoxy)phenyl]dimethyl methane, and ethylene oxide (EO)-modified products thereof, and propylene oxide (PO)-modified compounds thereof.

As the unsaturated carboxylic acid ester, itaconic acid ester is preferable, and examples thereof include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of crotonic acid ester include ethylene glycol dicrotonate, tetramethylene glycol dicrotonate, pentaerythritol dicrotonate, and sorbitol tetradicrotonate. Examples of isocrotonic ester include ethylene glycol diisocrotonate, pentaerythritol diisocrotonate, and sorbitol tetraisocrotonate. Examples of the maleic acid ester include ethylene glycol dimalate, triethylene glycol dimalate, pentaerythritol dimalate, and sorbitol tetramalate.

Specific examples of ester monomers of an aliphatic polyhydric alcohol compound and unsaturated carboxylic acid include ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylolpropane tri(acryloyloxy propyl) ether, trimethylolethane triacrylate, hexanediol diacrylate, 1,4-cyclohexanediol diacrylate, tetraethylene glycol diacrylate, tricyclodecane dimethanol diacrylate, tricyclodecane methanol dimethacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyl oxyethyl) isocyanurate, and polyester acrylate oligomer, as (meth)acrylic acid ester. Examples thereof also include EO-modified products or PO-modified products of these compounds.

For example, aliphatic alcohol-based esters disclosed in JP1976-47334B (JP-S51-47334B), JP1982-196231A (JP-S57-196231A), ester having an aromatic skeleton disclosed in JP1984-5240A (JP-S59-5240A), JP1984-5241A (JP-S59-5241A), JP1990-226149A (JP-H02-226149A), and ester containing an amino group disclosed in JP1989-165613A (JP-H01-165613A) are suitably used as examples of the other ester. Further, the ester monomers can be also used as a mixture.

Specific examples of the amide monomer of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacryl amides, diethylenetriamine tris-acrylamide, xylylene bisacrylamide, and xylylene bismethacrylamide. Specific examples of the other preferable amide-based monomer include a monomer having a cyclohexylene structure disclosed in JP1979-21726B (JP-S54-21726B).

An urethane-based addition polymerizable compound manufactured by using addition reaction between isocyanate and a hydroxyl group are also preferably, and specific examples thereof include a vinyl urethane compound containing two or more polymerizable vinyl groups in one molecule obtained by adding a vinyl monomer containing a hydroxyl group represented by Formula (E) below to a polyisocyanate compound having two or more polyisocyanate groups in one molecule disclosed in JP1973-41708B (JP-S48-41708B).

$$CH_2=C(R^4)COOCH_2CH(R^5)OH \quad (E)$$

[However, $R^4$ and $R^5$ each independently represent H or $CH_3$.]

Urethane acrylates disclosed in JP1976-37193A (JP-S51-37193A), JP1990-32293B, and JP1990-16765B (JP-H02-16765B) and urethane compounds having an ethylene oxide-based skeleton disclosed in JP1983-49860B (JP-S58-49860B), JP1981-17654B (JP-S56-17654B), JP1987-39417B (JP-S62-39417B), and JP1987-39418B (JP-S62-39418B) are also suitable. Addition polymerizable compounds having an amino structure or a sulfide structure in a molecule disclosed in JP1988-277653A (JP-S63-277653A), JP1988-260909A (JP-S63-260909A), and JP1989-105238A (JP-H01-105238A) can be used.

Other examples thereof include polyfunctional acrylates and methacrylates such as polyester acrylates and epoxy acrylates obtained by reacting an epoxy resin and (meth) acrylic acid disclosed in respective publications of JP1973-64183A (JP-S48-64183A), JP1974-43191B (JP-S49-43191B), and JP1977-30490B (JP-S52-30490B). Examples thereof also include specific unsaturated compounds disclosed in JP1971-43946B (JP-S46-43946B), JP1989-40337B (JP-H01-40337B), and JP1989-40336B (JP-H01-40336B) and vinylphosphonic acid-based compounds disclosed in JP1990-25493A (JP-H02-25493A). In a certain case, a structure containing a perfluoroalkyl group disclosed in JP1986-22048A (JP-S61-22048A) is suitably used. Compounds disclosed as photocurable monomers and oligomers in Adhesion Society of Japan, vol. 20, No. 7, pages 300 to 308 (1984) also can be used.

According to the invention, in a case where a radically polymerizable compound is added, in view of curing sensitivity, it is preferable to use a polyfunctional polymerizable compound containing two or more ethylenically unsaturated bonds and it is more preferable to use a polyfunctional polymerizable compound containing three or more ethylenically unsaturated bonds. Among these, it is preferable to contain two or more (meth)acrylic acid ester structures, it is more preferable to contain three or more (meth)acrylic acid ester structures, and it is most preferable to contain four or more (meth)acrylic acid ester structures.

In view of curing sensitivity and developability of an unexposed portion, a compound containing an EO-modified product is preferable. In view of curing sensitivity and strength of an exposed portion, a compound including an urethane bond is also preferably used. In view of developability when patterns are formed, a compound having an acid group is preferably used.

In view of the above, examples of the polymerizable compound according to the invention preferably include bisphenol A diacrylate, a bisphenol A diacrylate EO-modified product, trimethylolpropane triacrylate, trimethylolpropane tri(acryloyloxypropyl) ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, a pentaerythritol tetraacrylate EO-modified product, a dipentaerythritol hexaacrylate EO-modified product, and tricyclodecanedimethanol diacrylate. As commercially available products, urethane oligomers UAS-10 and UAB-140 (above manufactured by Nippon Paper Industries Co., Ltd.) are preferable.

Among these, a bisphenol A diacrylate EO-modified product, pentaerythritol triacrylate, pentaerythritol tetraacrylate, dipentaerythritol pentaacrylate, dipentaerythritol hexaacrylate, tri(acryloyloxyethyl)isocyanurate, a pentaerythritol tetraacrylate EO-modified product, and a dipentaerythritol hexaacrylate EO-modified product are more preferable, and as commercially available products, DPHA-40H (manufactured by Nippon Kayaku Co., Ltd.), UA-306H, UA-306T, UA-3061, AH-600, T-600, and AI-600 (manufactured by Kyoeisha Chemical Co., Ltd.), and A-DCP (manufactured by Shin-Nakamura Chemical Co., Ltd.) are more preferable.

Ethylenically unsaturated compounds having an acid group are also suitable, and examples of the commercially available product include TO-756 including carboxyl group-containing trifunctional acrylate and TO-1382 including carboxyl group-containing pentafunctional acrylate.

Examples of polymerizable compounds having high heat resistance include benzocyclobutene (BCB), bisallylnadiimide (BANI), benzoxazine, and melamine, and analogs thereof.

Among these polymerizable compounds, examples of difunctional polymerizable compounds include NK ESTER A-BPE-20 manufactured by Shin-Nakamura Chemical Co., Ltd. and LIGHTACRYLATE DCP-A manufactured by Kyoeisha Chemical Co., Ltd. Examples of a mixture of trifunctional and tetrafunctional polymerizable compounds include ARONIX M-305 and M-510 manufactured by Toagosei Co., Ltd. Examples of tetrafunctional polymerizable compounds include KAYARAD RP-1040 manufactured by Nippon Kayaku Co., Ltd., and NK ESTER A-TMMT manufactured by Shin-Nakamura Chemical Co., Ltd. Examples of a mixture of tetrafunctional and hexafunctional polymerizable compounds include KAYARAD DPHA manufactured by Nippon Kayaku Co., Ltd. Examples of hexafunctional polymerizable compounds include KAYARAD DPCA-20 manufactured by Nippon Kayaku Co., Ltd. and NK ESTER A-DPH-12E manufactured by Shin-Nakamura Chemical Co., Ltd. Examples of polymerizable compounds also include ARONIX TO-756 manufactured by Toagosei Co., Ltd.

Two or more types of the polymerizable compound can be used.

The content of the polymerizable compound in the composition is not particularly limited. However, in view of excellent strength of the infrared cut filter, the content thereof is preferably 1 to 20 mass % and more preferably 3 to 10 mass % with respect to a total mass of the composition.

(Surfactant)

In view of increasing coating properties, a surfactant may be included in the composition.

As the surfactant, various surfactants such as a fluorine-based surfactant, a nonionic surfactant, a cation-based surfactant, an anionic surfactant, and a silicone-based surfactant can be used. Particularly, if the composition according to the invention contains at least one of a fluorine-based surfactant or a silicone-based surfactant, liquid characteristics (particularly, fluidity) when the composition is prepared as a coating liquid are further improved. Accordingly, evenness of coating thickness and liquid saving properties are further improved.

That is, in case of a composition containing at least one of the fluorine-based surfactant or the silicone-based surfactant, wettability to a coated surface is improved and thus coating properties to the coated surface are improved. Therefore, even in a case where a thin film in about several μ is formed with a small amount of liquid, it is effective that a film that has small unevenness of a thickness and has a homogeneous thickness can be more suitably formed.

A fluorine content of the fluorine-based surfactant is suitably 3 to 40 mass %, more preferably 5 to 30 mass %, and particularly preferably 7 to 25 mass %. A fluorine-based surfactant having a fluorine content in the range described above is effective in view of evenness of thickness or liquid saving properties of a coated film, and solubility in the composition is satisfactory.

Specific examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781, MEGAFACE F781F (above, manufactured by DIC Corporation), FLUORAD FC430, FLUORAD FC431, and FLUORAD FC171 (above, manufactured by Sumimoto 3M Limited.), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (above, manufactured by Asahi Glass Co., Ltd.), PF636, PF656, PF6320, PF6520, and PF7002 (manufactured by OMNOVA Solutions Inc.). Examples thereof also include surfactants disclosed in paragraph 0552 of JP2012-208494A (corresponding to [0678] of US2012/0235099A), and the contents thereof are incorporated to this specification.

Examples of the nonionic surfactant include polyoxyethylene alkyl ether, polyoxyethylene alkyl allyl ether, polyoxyethylene aliphatic acid ester, sorbitan aliphatic acid ester, polyoxyethylene sorbitan aliphatic acid ester, polyoxyethylene alkylamine, glycerin aliphatic acid ester, an oxyethylene oxypropylene block copolymer, an acetylene glycol-based surfactant, and acetylene-based polyoxyethylene oxide. These may be used singly or two or more types can be used.

Specific product names thereof include SUFYNOL 61, 82, 104, 104E, 104H, 104A, 104BC, 104DPM, 104PA, 104PG-50, 104S, 420, 440, 465, 485, 504, CT-111, CT-121, CT-131, CT-136, CT-141, CT-151, CT-171, CT-324, DF-37, DF-58, DF-75, DF-110D, DF-210, GA, OP-340, PSA-204, PSA-216, PSA-336, SE, SE-F, and TG, DYNOL 604 (above, manufactured by Nissin Chemical Co., Ltd. and Air Products and Chemicals, Inc.), OLFINE A, B, AK-02, CT-151W, E1004, E1010, P, SPC, STG, Y, 32W, PD-001, PD-002W, PD-003, PD-004, EXP.4001, EXP.4036, EXP.4051, AF-103, AF-104, SK-14, and AE-3 (above, manufactured by Nissin Chemical Co., Ltd.), and ACETYLENOL E00, E13T, E40, E60, E81, E100, and E200 (all above are product names, manufactured by Kawaken Fine Chemicals Co., Ltd.).

Specific examples of the nonionic surfactant further include nonionic surfactants disclosed in paragraph 0553 of JP2012-208494A ([0679] of corresponding US2012/0235099A), and the contents thereof are incorporated to this specification.

Specific examples of the cation-based surfactant include cation-based surfactants disclosed in paragraph 0554 of JP2012-208494A ([0680] of corresponding US2012/0235099A), and the contents thereof are incorporated to this specification.

Specific examples of the anionic surfactant include W004, W005, and W017 (manufactured by Yusho Co., Ltd.).

Examples of the silicone-based surfactant include silicone-based surfactants disclosed in paragraph 0556 of JP2012-208494A ([0682] of corresponding US2012/0235099A), and the contents thereof are incorporated to this specification. "TORAY SILICONE SF8410", "TORAY SILICONE SF8427", "TORAY SILICONE SH8400", "ST80PA", "ST83PA", and "ST86PA" manufactured by Dow Corning Corporation, "TSF-400", "TSF-401", "TSF-410", and "TSF-4446" manufactured by Momentive Performance Materials Inc., and "KP321", "KP323", "KP324", "KP340", "KF6001", "KF6002", and "KF6003" manufactured by Shin-Etsu Chemical Co., Ltd are also exemplified.

The content of the surfactant in the composition is not particularly limited. However, in view of excellent strength of the infrared cut filter, the content thereof is preferably 0.0001 to 0.1000 mass % and more preferably 0.0010 to 0.0700 mass % with respect to a total mass of the composition.

(Dispersing Agent)

A dispersing agent may be included in the composition. If a dispersing agent is included, dispersion stability of the tungsten oxide fine particles in the composition increases. The dispersing agent also functions as the binder described above.

Examples of the dispersing agent include a polymer dispersant [for example, polyamidoamine and salts thereof, polycarboxylic acid and salts thereof, high molecular weight unsaturated acid ester, modified polyurethane, modified polyester, modified poly(meth)acrylate, a (meth)acrylic copolymer, and naphthalenesulfonic acid formalin condensate], and surfactants such as polyoxyethylene alkyl phosphoric acid ester, polyoxyethylene alkylamine, alkanolamine.

The polymer dispersant can be classified into a linear polymer, a terminal-modified polymer, a graft-type polymer, and a block-type polymer, depending on structures thereof.

Examples of the the terminal-modified polymer having an anchoring site to the surface include polymers having phosphoric acid groups at terminals disclosed in JP1991-112992A (JP-H03-112992A) and JP2003-533455A, polymers having sulfonic acid groups at terminals disclosed in JP2002-273191A, polymers having partial skeletons or heterocyclic rings of organic coloring agents disclosed in JP1997-77994A (JP-H09-77994A), and an oligomer or a polymer having a hydroxyl group or an amino group at one terminal and a polymer manufactured by being modified with acid anhydride disclosed in JP2008-29901A. A polymer obtained by introducing an anchoring site (an acid group, a basic group, a partial skeleton of an organic coloring agent, a heterocyclic ring, or the like) to surfaces of two or more tungsten oxide fine particles at terminals of polymers disclosed in JP2007-277514A also has excellent dispersion stability and thus is preferable.

Examples of a graft-type polymer having an anchoring site to the surface thereof include reaction products of poly(lower alkylene imine) and polyester disclosed in JP1979-37082A (JP-S54-37082A), JP1996-507960A (JP-H08-507960A), and JP2009-258668A, reaction products of polyallylamine and polyester disclosed in JP1997-169821A (JP-H09-169821A), amphoteric dispersing resins having a basic group and an acidic group disclosed in JP2009-203462A, copolymers of macromonomers and nitrogen atom monomers disclosed in JP1998-339949A (JP-H10-339949A) and JP2004-37986A, graft-type polymers having heterocyclic rings and partial skeletons of organic coloring agents disclosed in JP2003-238837A and JP2008-9426A, and JP2008-81732A, and copolymers of macromonomers and acid group-containing monomers disclosed in JP2010-106268A.

As the macromonomers used when graft-type polymers having anchoring sites on surfaces are manufactured by radical polymerization, well-known macromonomers can be used. Examples thereof include macromonomers AA-6 (polymethyl methacrylate of which a terminal group is a methacryloyl group), AS-6 (polystyrene of which a terminal group is a methacryloyl group), AN-6S (a copolymer of styrene and acrylonitrile of which a terminal group is a methacryloyl group), and AB-6 (polybutyl acrylate of which a terminal group is a methacryloyl group) manufactured by Toagosei Co., Ltd., PLACCEL FM5 manufactured by Daicel Corporation (a 5 molar equivalent ε-caprolactone adduct of 2-hydroxyethyl methacrylate), FA10L (a 10 molar equivalent ε-caprolactone adduct of 2-hydroxyethyl acrylate) manufactured by Daicel Corporation, and a polyester-based macromonomer disclosed in JP1990-272009A (JP-H02-272009A). In view of dispersibility and dispersion stability of tungsten oxide fine particles in a composition, a polyester-based macromonomer having excellent flexibility and solvophilic properties is particularly preferable and a polyester-based macromonomer represented by the polyester-based macromonomer disclosed in JP1990-272009A (JP-H02-272009A) is most preferable.

As the block-type polymer having an anchoring site on the surface thereof, block-type polymers disclosed in JP2003-49110A and JP2009-52010A are preferable.

For example, as the dispersing agent, well-known dispersing agents or surfactants can be appropriately selected to be used.

Specific examples thereof include "Disperbyk-101 (polyamideamine phosphate salt), 107 (carboxylic acid ester), 110 (a copolymer containing an acid group), 130 (polyamide), 161, 162, 163, 164, 165, 166, and 170 (high molecular weight copolymer)" and "BYK—P104 and P105 (high molecular weight unsaturated polycarboxylic acid)" manufactured by BYK Chemie GmbH, "EFKA4047, 4050, and 4010 (polyurethane-based), EFKA4330, 4340 (block copolymer), 4400 to 4402 (modified polyacrylate), 5010 (polyesteramide), 6220 (aliphatic acid polyester), and 6745 (phthalocyanine derivative)" manufactured by BASF SE, "AJISPER PB821, PB822, PB880, and PB881" manufactured by Ajinomoto Fine-Techno Co., Inc., "FLOWLEN TG-710 (urethane oligomer)" and "Polyflow No. 50E and No. 300 (acrylic copolymer)" manufactured by Kyoeisya Chemical Co., Ltd., "DISPARLON KS-860, 873SN, 874, and #2150 (aliphatic polyvalent carboxylic acid), #7004 (polyether ester), and DA-703-50, DA-705, and DA-725" manufactured by Kusumoto Chemicals Ltd., "DEMOL RN, and N (naphthalene sulfonic acid formalin polycondensate), MS, C, and SN—B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" manufactured by Kao Corporation, "SOLSPERSE 5000 (phthalocyanine derivative), 13240 (polyesteramide), 3000, 17000, and 27000 (polymers having functional groups at terminals thereof), 24000, 28000, 32000, and 38500 (graft polymers)" manufactured by Lubrizol Japan Limited, "NIKKOLE T106 (polyoxyethylene sorbitan monooleate) and MYS-IEX (polyoxyethylene monostearate)" manufactured by Nikko Chemicals Co., Ltd., "HINOACT T-8000E" manufactured by Kawaken Fine Chemicals Co., Ltd., an organosiloxane polymer "KP-341" manufactured by Shin-Etsu Chemical Co., Ltd., "W001: cationic surfactant", nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan aliphatic acid ester, and anionic surfactants such as "W004, W005, and W017" manufactured by Yusho Co., Ltd., "EFKA-46, EFKA-47, EFKA-47EA, EFKA polymer 100, EFKA polymer 400, EFKA polymer 401, and EFKA polymer 450" manufactured by Morishita & Co., Ltd., polymer dispersants such as "DISPERSE AID 6, DISPERSE AID 8, DISPERSE AID 15, and DISPERSE AID 9100" manufactured by San Nopco Limited, ADEKA PLURONIC L31, F38, L42, L44, L61, L64, F68, L72, P95, F77, P84, F87, P94, L101, P103, F108, L121, and P-123 manufactured by ADEKA Corporation), and "ISONET (trade name) S-20" manufactured by Sanyo Chemical Industries.

These dispersing agents may be used singly or two or more types thereof may be used in combination. The dispersing agent may be used together with alkali-soluble resin, in addition to a terminal-modified polymer having an anchor site, a graft-type polymer, or a block-type polymer. Examples of the alkali-soluble resin include a (meth)acrylic acid copolymer, an itaconic acid copolymer, a crotonic acid copolymer, a maleic acid copolymer, a partially esterified maleic acid copolymer, acidic cellulose derivatives having a carboxylic acid in a side chain, and a resin obtained by modifying acid anhydride to a polymer having a hydroxyl group. However, a (meth)acrylic acid is particularly preferable. N-position substituted maleimide monomer copolymers disclosed in JP1998-300922A (JP-H10-300922A), alkali-soluble resins containing polymerizable groups disclosed in JP1995-319161A (JP-H07-319161A), and dispersed resins disclosed in section 0173 and following sections of JP2012-122045A (section 0316 and following sections of corresponding US2013/0072615A) (specific examples are Exemplary Compounds 1 to 71 in paragraph 0079 of JP2010-106268A ([0121] of corresponding US2011/0124824A) and following paragraphs) are also preferable.

In a case where a dispersing agent is used, after a dispersion composition is first prepared with tungsten oxide fine particles (and other infrared shielding agents, if necessary), a dispersing agent, and a proper solvent, the dispersion composition is formulated with other components, in view of dispersibility improvement.

The composition may not include a dispersing agent. However, in a case where the composition includes a dispersing agent, the content thereof is preferably 10 to 70 mass % and more preferably 30 to 60 mass % with respect to a total mass of tungsten oxide fine particles.

(Polymerization Initiator)

The polymerization initiator may be included in the composition. In a case where the polymerization initiator is included, the polymerizable compound or the like are effectively polymerized, so as to obtain an infrared cut filter having excellent film hardness.

The polymerization initiator is not particularly limited, as long as the polymerization initiator has performance of initiating polymerization of a polymerizable compound due to light, heat, or the both. The polymerization initiator can be appropriately selected according to the purpose, but is preferably a photopolymerization initiator. In a case where the polymerization is initiated with light, it is preferable to have photosensitivity from an ultraviolet range to visible light.

In a case where polymerization is initiated with heat, an initiator that performs decomposition at 150° C. to 250° C. is preferable.

The polymerization initiator is preferably a compound having at least an aromatic group. Examples thereof include an acylphosphine compound, an acetophenone compound, an α-aminoketone compound, a benzophenone compound, a benzoin ether compound, a ketal derivative compound, a thioxanthone compound, an oxime compound, a hexaarylbiimidazole compound, a trihalomethyl compound, an azo compound, organic peroxide, onium salt compounds such as a diazonium compound, an iodonium compound, a sulfonium compound, an azinium compound, and a metallocene compound, an organic boron salt compound, and a disulfone compound.

In view of sensitivity, an oxime compound, a hydroxyacetophenone compound, an aminoacetophenone compound, an acylphosphine compound, an α-aminoketone compound, a trihalomethyl compound, a hexaarylbiimidazole compound, and a thiol compound are preferable. Among these, an oxime compound or an α-amino ketone compound is more preferable, and an oxime compound is even more preferable.

As a hydroxyacetophenone compound, IRGACURE-184, DAROCUR-1173, IRGACURE-500, IRGACURE-2959, and IRGACURE-127 (product name: all are manufactured by BASF SE) can be used. As an aminoacetophenone compound, IRGACURE-907, IRGACURE-369, and IRGACURE-379 (product name: all are manufactured by BASF SE) which are commercially available products can be used. As an acylphosphine compound, IRGACURE-819 or DAROCUR-TPO (product name: all are manufactured by BASF SE) which are commercially available products can be used.

Examples of the commercially available product of the oxime compound suitably include IRGACURE OXE 01 (1,2-octanedione, 1-[4-(phenylthio)-, 2-(o-benzoyl oxime)]), IRGACURE OXE 02 (ethanone, 1-[9-ethyl-6-(2-methylbenzoyl)-9H-carbazol-3-yl]-, and 1-(o-acetyl oxime)) manufactured by BASF SE.

As the oxime compound, description of compounds represented by Formula (OX-1), (OX-2), or (OX-3) disclosed in paragraph 0513 of JP2012-208494A (corresponding to [0632] of US2012/235099A) and following paragraphs are referred, and the contents thereof are incorporated to this specification.

Examples of the oxime compound include polymerization initiators disclosed in paragraphs [0092] to [0096] of JP2012-113104A, and the contents thereof are incorporated to this specification.

Examples of the commercially available product of the oxime compound include TRONLY TR-PBG-304, TRONLY TR-PBG-309, and TRONLY TR-PBG-305 (manufactured by CHANGZHOU TRONLY NEW ELECTRONIC MATERIALS CO., LTD).

The content of the polymerization initiator in the composition is not particularly limited. However, in view of excellent drying resistance, the content thereof is preferably 0.1 to 10 mass % and more preferably 0.5 to 5.0 mass % with respect to a total mass of the composition.

(Polymerization Inhibitor)

A polymerization inhibitor may be included in the composition. If a polymerization inhibitor is included, unnecessary thermal polymerization of the polymerizable compound in manufacturing or preservation of the composition can be prevented.

As the polymerization inhibitor, well-known compounds can be used. Examples thereof include hydroquinone, p-methoxyphenol, di-t-butyl-p-cresol, pyrogallol, t-butyl-catechol, benzoquinone, 4,4'-thiobis(3-methyl-6-t-butylphenol), 2,2'-methylenebis(4-methyl-6-t-butylphenol), and N-nitrosophenylhydroxylamine cerous salt.

The content of the polymerization inhibitor in the composition is not particularly limited. However, the content thereof is preferably 0.0001 to 0.05 mass % and more preferably 0.0005 to 0.01 mass % with respect to a total solid mass content.

(Ultraviolet Absorbing Agent (UV Absorbing Agent))

An ultraviolet absorbing agent may be included in the composition. If the ultraviolet absorbing agent is included, residues that remain on the substrate can be reduced.

The ultraviolet absorbing agent refers to a compound that does not have a function of initiating polymerization of the polymerizable compound with light or heat (that is, that does not correspond to a polymerization initiator). Here, the expression "not having a function of initiating polymerization of a polymerizable compound" practically means not generating active species for initiating polymerization of a polymerizable compound, even if an ultraviolet absorbing agent receives energies of light or heat.

More specifically, it is preferable that the ultraviolet absorbing agent does not have photosensitivity with respect to ultraviolet rays or visible light (more specifically, light at a wavelength of 300 to 450 nm) and does not have thermosensitivity with respect to heat (more specifically, for example, heat at 150° C. to 250° C.). Here, the expressions "photosensitivity" and "thermosensitivity" mean exhibiting desired functions accompanied by changes of chemical structure due to ultraviolet rays, visible light, or heat.

It is preferable that the ultraviolet absorbing agent does not have characteristics of a sensitizer described below as well as not have the function of initiating polymerization of the polymerizable compound. Here, the characteristics of a sensitizer refer to characteristics of initiating characteristics by giving energies obtained by itself by absorbing heat to another substance (polymerization initiator or the like).

The ultraviolet absorbing agent preferably has a maximum absorption wavelength particularly between a wavelength between 300 nm and 430 nm and particularly preferably has a maximum absorption wavelength between a wavelength between 330 nm and 420 nm.

It is preferable that the ultraviolet absorbing agent has a maximum absorption wavelength more preferably in at least one of (I) a wavelength range of 340 nm to 380 nm, (II) a wavelength range of 380 nm to 420 nm, or (III) a wavelength range of 420 nm to 450 nm.

The type of the ultraviolet absorbing agent is not particularly limited. However, for example, salicylate-based, benzophenone-based, benzotriazole-based, substituted acrylonitrile-based, or triazine-based ultraviolet absorbing agents can be suitably used.

Examples of the salicylate-based ultraviolet absorbing agent include phenyl salicylate, p-octyl phenyl salicylate, and p-t-butyl phenyl salicylate. Examples of the benzophenone-based ultraviolet absorbing agent include 2,2'-dihydroxy-4-methoxybenzophenone, 2,2'-dihydroxy-4,4'-dimethoxy benzophenone, 2,2',4,4'-tetrahydroxy benzophenone, 2-hydroxy-4-methoxybenzophenone, 2,4-dihydroxybenzophenone, and 2-hydroxy-4-octoxybenzophenone.

Examples of the benzotriazole-based ultraviolet absorbing agent include 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tertamyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3', 5'-di-tert-butylphenyl)benzotriazole, 2-(2'-hydroxy-5'-methylphenyl)benzotriazole, and 2-[2'-hydroxy-5'-(1,1,3,3-tetramethyl)phenyl]benzotriazole.

Examples of the substituted acrylonitrile-based ultraviolet absorbing agent include ethyl 2-cyano-3,3-diphenyl acrylate and 2-cyano-3,3-diphenyl acrylate-2-ethylhexyl. Examples of the triazine-based ultraviolet absorbing agent include a mono (hydroxyphenyl)triazine compound such as 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2-(2,4-dihydroxyphenyl)-4,6-bis(2,4-dimethylphenyl)-1,3,5-triazine; a bis(hydroxyphenyl)triazine compound such as 2,4-bis(2-hydroxy-4-propyloxyphenyl)-6-(2,4-dimethylphenyl)-1,3,5-triazine, 2,4-bis(2-hydroxy-3-methyl-4-propyloxyphenyl)-6-(4-methylphenyl)-1,3,5-triazine, and 2,4-bis(2-hydroxy-3-methyl-4-hexyloxyphenyl)-6-(2,4-dimethylphenyl)1,3,5-triazine; and a tris(hydroxyphenyl) triazine compound such as 2,4-bis(2-hydroxy-4-butoxyphenyl)-6-(2,4-dibutoxyphenyl)-1,3,5-triazine, 2,4,6-tris(2-hydroxy-4-octyloxyphenyl)-1,3,5-triazine, 2,4,6-tris[2-hydroxy-4-(3-butoxy-2-hydroxypropyloxy)phenyl]-1,3, 5-triazine.

Other diethylamino phenylsulfonyl pentadienoate-based ultraviolet absorbing agents (manufactured by FUJIFILM Finechemicals Co., Ltd., product name: DPO), and the like also can be suitably used.

Compounds represented by any one of Formulae (1) to (8) of paragraph 0103 of JP2012-32556A (page 30 of corresponding WO2012/015076A) or Specific Examples (1-1) to (8-3) thereof are referred to, and the contents thereof are incorporated to this specification.

The content of the ultraviolet absorbing agent in the composition is not particularly limited. However, in view of excellent drying resistance and suppression of residues, the content thereof is preferably 0.01 to 10.0 mass % and more preferably 0.05 to 1.50 mass % with respect to a total mass of the composition.

(Sensitizer)

A sensitizer may be included in the composition.

It is preferable that the sensitizer is increased or decreased with an electron transfer mechanism or an energy transfer mechanism with respect to the photopolymerization initiator.

A type of the sensitizer used is not particularly limited. However, examples thereof include compounds exemplified in paragraph [0202] of JP2012-122045A.

The content of the sensitizer in the composition is not particularly limited. However, the content thereof is preferably 0.01 to 10.0 mass % and more preferably 0.10 to 4.00 mass % with respect to a total solid content in the composition.

(Crosslinking Agent)

A crosslinking agent may be included in the composition. If the crosslinking agent is included, it is expected that the strength of the infrared cut filter is increased.

It is preferable that the crosslinking agent is a compound having a crosslinkable group, and it is more preferable that the crosslinking agent is a compound two or more crosslinkable groups. Specific examples of the crosslinkable group suitably include an oxetane group, a cyanate group, and groups the same as those exemplified as the crosslinkable groups that an alkali-soluble binder may have. Among these, an epoxy group, an oxetane group, or a cyanate group is preferable. That is, particularly, the crosslinking agent is preferably an epoxy group compound, an oxetane compound, or a cyanate compound.

A type of the crosslinking agent used is not particularly limited. Examples thereof include a compound exemplified as paragraphs [0204] to [0209] of JP2012-122045A.

(Curing Accelerator)

A curing accelerator may be included in the composition.

A type of the curing accelerator used is not particularly limited. Examples thereof include compounds exemplified in paragraph [0211] of JP2012-122045A.

(Filler)

A filler may be included in the composition. If a filler is included in the composition, it is possible to obtain an infrared cut filter high scratch resistance and high wear resistance.

Examples of the filler suitably include spherical silica subjected to a surface treatment with a silane coupling agent.

A type of the filler used is not particularly limited. Examples thereof include fillers exemplified in paragraphs [0212] to [0222] of JP2012-122045A.

(Elastomer)

An elastomer may be included in the composition. If an elastomer is included in the composition, it is possible to increase heat resistance, thermal shock resistance, flexibility, and toughness, together with increasing adhesiveness of the infrared cut filter.

A type of the elastomer used is not particularly limited. However, examples thereof are the elastomer exemplified in paragraphs [0225] to [0235] of JP2012-122045A.

In addition to the essential components or preferable additives described above, without departing from the gist of the invention, other components may be appropriately selected to be used in the composition, depending on the purposes.

Examples of other components that can be used together include a thermal hardening accelerator, a plasticizer, and a coloring agent (a coloration pigment or a dye). An adhesion promoter to a surface of a base material and other auxiliary agents (for example, conductive particles, a filler, an antifoaming agent, a flame retardant, a leveling agent, a peeling promoter, an antioxidant, a fragrance material, a surface tension adjuster, and a chain transfer agent) may be used together.

Examples of the aforementioned pigment that can be used include at least one organic pigment selected from a red organic pigment, a yellow organic pigment, a violet organic pigment, or an orange organic pigment. If the pigments are used together, a tint is improved.

Examples of the organic pigment include a diketopyrrolopyrrole pigment, a perylene-based pigment, a benzimidazolone-based pigment, a perinone-based pigment, a naphthol AS-based pigment, an anthraquinone-based pigment, a pyrazolone-based pigment, or an isoindolinone-based pigment. Specific examples thereof include pigments disclosed in paragraphs 0031 to 0033 of JP2011-057964A (paragraphs 0045 to 0051 of corresponding US2012/0104529A), and the contents thereof are included in this specification.

In order to improve near infrared shielding properties, a near infrared absorption coloring agent may be used in the composition.

As a suitable form of the near infrared absorption coloring agent, a coloring agent having a maximum absorption wavelength at a first wavelength range: 800 to 869 nm, a coloring agent having a maximum absorption wavelength at a second wavelength range: 870 to 909 nm, a coloring agent having a maximum absorption wavelength at a third wavelength range: 910 to 949 nm, or a coloring agent having a maximum absorption wavelength at a fourth wavelength range: 950 to 1,000 nm are preferable.

Examples of the phthalocyanine-based coloring agent having a maximum absorption wavelength in the first wavelength range include "EXCOLOR IR-14" (λmax: 819 nm) and "EXCOLOR IR-10A" (λmax: 849 nm) manufactured by Nippon Shokubai Co., Ltd. λmax indicated between parentheses after product name refers to a maximum absorption wavelength.

Examples of the phthalocyanine-based coloring agent having a maximum absorption wavelength in the second wavelength range include "EXCOLOR IR-28" (λmax: 880 nm), "EXCOLOR IR-12" (λmax: 883 nm), and "TX-EX-820" (λmax: 891 nm).

Examples of the phthalocyanine-based coloring agent having a maximum absorption wavelength in the third wavelength range include "TX-EX-906" (λmax: 922 nm).

Examples of the phthalocyanine-based coloring agent having a maximum absorption wavelength in the fourth wavelength range include "EXCOLOR IR-915" (λmax: 963 nm), "EXCOLOR IR-910" (λmax: 968 nm), and "EXCOLOR IR-906" (λmax: 968 nm).

In order to block light at a wavelength of 850 to 950 nm, Excolor IR-28 and Excolor 815K (phthalocyanine-based pigment) manufactured by Nippon Shokubai Co., Ltd. are suitably exemplified.

The composition according to the invention can be prepared by mixing respective components.

The use of the composition according to the invention is not particularly limited. However, the composition according to the invention can form an infrared shielding layer, and can be used, for example, for an infrared cut filter. For example, the composition according to the invention can be used for an infrared cut filter on a light receiving side of a solid-state imaging device and an infrared cut filter on an opposite side (an opposite side of a light receiving side) of a solid-state imaging device.

The composition according to the invention may be used on a color filter or by directly coating a planarizing layer and forming a coated film.

Since the composition according to the invention can be supplied in a coatable state, an infrared cut filter can be easily formed in a desired member or at a desired position of the solid-state imaging device.

<Infrared Cut Filter>

Subsequently, the infrared cut filter according to the invention is described.

The infrared cut filter according to the invention is formed by using the composition according to the invention described above.

A film thickness of the infrared cut filter can be appropriately selected depending on purposes, preferably 20 μm or less, more preferably 10 μm or less, and further preferably 5 μm or less. For example, the lower limit of the film thickness is preferably 0.1 μm or greater, more preferably 0.2 μm or greater, and more preferably 0.3 μm or greater in order to maintain light shielding properties. According to the invention, since the infrared absorption filter has high infrared shielding properties, the film thickness of the infrared cut filter can be reduced.

The maximum transmittance of the infrared cut filter at the wavelength of 400 to 1,300 nm is not particularly limited. However, the maximum transmittance is preferably 60% or greater and more preferably 65% or greater.

The maximum transmittance of the infrared cut filter at the wavelength of 900 to 1,300 nm is not particularly limited. However, the maximum transmittance is preferably 20% or less, more preferably 10% or less, and most preferably 5% or less.

The infrared cut filter is used for a lens (a lens for a camera such as a digital camera or a vehicle camera and an optical lens such as a f-θ lens or a pickup lens) having a function of absorbing and cutting infrared light, an optical filter for a semiconductor light-receiving element, an infrared cut filter for a proximity illuminance sensor, a heat ray cut filter or an infrared ray absorption plate that cuts off heat rays for energy saving, an agricultural coating agent for the purpose of selective use of sunlight, a recording medium that uses an infrared absorption heat, a near-infrared cut filter for electronic equipment and photos, safety glasses, sunglasses, a heat ray cut film, recording for optical character reading, the use of the confidential document copy prevention, an electrophotographic photoreceptor, laser welding, and the like. The infrared absorption filter according to the invention is also useful for a noise cut filter for a CCD camera or a filter for a CMOS image sensor.

The method of manufacturing the infrared cut filter is not particularly limited. However, the infrared cut filter can be manufactured by a step of applying the composition according to the invention to a support (preferably, a dropwise addition method, coating, or printing) and a method of drying a film. The film thickness and the laminate structure can be appropriately selected according to the purpose. As described below, a step of forming patterns may be performed.

A step of forming a film can be performed, by using the composition according to the invention on a support by a dropwise addition method (drop cast), a spin coater, a slit spin coater, a slit coater, screen printing, applicator coating, and the like.

The support to which the composition according to the invention is applied may be a transparent substrate consisting of glass or the like. The support may be respective members in a solid-state imaging device, may be another substrate provided on a light receiving side of the solid-state imaging device, and may be a layer such as a planarizing layer or the like provided on a light receiving side of the solid-state imaging device.

A method of manufacturing a pattern-shaped infrared cut filter is not particularly limited. However, examples thereof include methods including a step of forming a film-shaped composition layer obtained by applying the composition according to the invention a the support, a step of exposing the composition layer in a pattern shape, and a step of forming a pattern by developing and removing unexposed portions, and the like. With respect to a step of forming patterns, patterns can be formed by photolithography or a dry etching method.

In the method for manufacturing an infrared cut filter, other steps may be included. The other steps are not particularly limited and can be appropriately selected depending on purposes. Examples thereof include a step of treating a surface of a base material, a preheating step (prebaking step), a hardening treatment step, and a post heating step (post baking step).

The heating temperature in the preheating step and post heating step is generally 80° C. to 200° C. and preferably 90° C. to 150° C. The heating time in the preheating step and the post heating step is generally 30 seconds to 240 seconds and preferably 60 seconds to 180 seconds, in a case where a hot plate is used.

A hardening treatment step is a step of performing a hardening treatment on a formed film, if necessary. If this treatment is performed, mechanical strength of the infrared cut filter is improved.

The hardening treatment step is not particularly limited, and can be appropriately selected depending on purposes. Examples thereof suitably include an exposure treatment and an entire surface heating treatment. Here, the expression "exposure" according to the invention is used as a meaning of including not only light in various wavelengths but also radioactive ray irradiation such as electron rays or X rays.

The exposure is preferably performed by irradiation of radioactive rays. As the radioactive that can be used at the time of exposure, particularly, electron rays, KrF, ArF, ultraviolet rays such as g rays, h rays, and i rays, or visible light are preferably used.

Examples of an exposure technique include stepper exposure or exposure by a high pressure mercury vapor lamp.

An exposure amount is preferably 5 to 3,000 mJ/cm$^2$, more preferably 10 to 2,000 mJ/cm$^2$, and particularly preferably 50 to 1,000 mJ/cm$^2$.

Examples of the exposure treatment include a method for exposing an entire surface of the formed film. In a case where the composition according to the invention contains a polymerizable compound, hardening of the polymerizable compounds in the film is promoted by the entire surface exposure, such that hardening of the film further proceeds, and mechanical strength and durability further improve.

A device for performing the exposure is not particularly limited, and can be appropriately selected depending on purposes, and examples thereof suitably include a UV exposure machine such as a high pressure mercury vapor lamp.

Examples of the entire surface heating treatment method include a method for heating the entire surface of the formed film. With the heating of the entire surface, the film hardness of the pattern can be increased.

The heating temperature of the heating of the entire surface is preferably 120° C. to 250° C. and more preferably 160° C. to 220° C. If the heating temperature is 120° C. or greater, the film hardness improves by a heating treatment. If the heating temperature is 250° C. or less, the decomposition of the film component is suppressed.

The heating time for the heating of the entire surface is preferably 3 minutes to 180 minutes and more preferably 5 minutes to 120 minutes.

A device for heating the entire surface is not particularly limited, and can be appropriately selected among well-known devices, depending on purposes. Examples thereof include a dry oven, a hot plate, and an infrared ray (IR) heater.

<Solid-State Imaging Device>

The infrared cut filter can be suitably applied to a solid-state imaging device.

Hereinafter, one embodiment of the solid-state imaging device according to the invention is described by using FIG. 1.

In a solid-state imaging device (infrared sensor) 100 illustrated in FIG. 1, a reference numeral 110 is a solid-state imaging device substrate.

An infrared cut filter 111 and a color filter 112 are disposed on the solid-state imaging device substrate 110.

Areas 114 are provided between infrared ray transmission filters (color filter that transmits infrared light) 113 and the solid-state imaging device substrate 110. Resin layers (for example, transparent resin layers) that light in a wavelength that transmits the infrared ray transmission filters 113 transmits are provided on the areas 114. The infrared ray transmission filters 113 are formed on the areas 114. That is, the infrared ray transmission filters 113 may be formed on the solid-state imaging device substrate 110.

Microlenses 115 are provided on incidence rays hv side of the color filters 112 and the infrared ray transmission filters 113. A planarizing layer 116 is formed so as to cover the microlenses 115.

In FIG. 1, film thicknesses of the color filters 112 and film thicknesses of the infrared ray transmission filters 113 are the same, but film thicknesses of the both may be different from each other.

In FIG. 1, the color filters 112 are provided on the incidence rays hv side of the infrared cut filters 111, but the infrared cut filters 111 may be provided on the incidence rays hv side of the color filters 112 by changing an order of the infrared cut filters 111 and the color filters 112. Another layer may be formed between the infrared cut filter 111 and the color filter 112.

The color filter 112 preferably includes at least one selected from the group consisting of a color filter that transmits light at a red wavelength range, a color filter that transmits light at a green wavelength range, and a color filter that transmits light at a blue wavelength range.

The color filter 112 may be caused to contain an infrared absorption substance so as to cause the color filter 112 to have a function as an infrared cut filter.

Since the solid-state imaging device according to the invention includes an infrared cut filter inside, an infrared cut filter as a member of a camera module is not required, the number of components of the camera module can be reduced, and the camera module can be miniaturized.

The color filters 112 are not particularly limited, and color filters for forming pixels in the related art can be used. For example, disclosure in paragraphs 0214 to 0263 of JP2014-043556A can be referred to, and the contents thereof are incorporated to this specification.

Characteristics of the infrared ray transmission filter 113 are selected according to an emission wavelength of a light source.

One of the suitable forms of the solid-state imaging device preferably include a filter layer including at least one selected from the group consisting of a color filter (red color filter) that transmits light at a red wavelength range, a color filter (green color filter) that transmits light at a green wavelength range, a color filter (blue color filter) that transmits light at a blue wavelength range, and a color filter (infrared ray transmission filter) that transmits infrared light, and an infrared cut filter disposed disposed on a light incident side of the filter layer.

Examples thereof include a solid-state imaging device including a filter layer that has a red color filter, a green color filter, a blue color filter, and an infrared ray transmission filter on the same plane, and an infrared cut filter that is disposed on a light incident side of the filter layer and that is disposed on the entire surface of the filter layer.

The infrared cut filter may be disposed on a light incident side of the solid-state imaging device substrate 110. For example, the infrared cut filter may be disposed on the red color filter, the green color filter, and the blue color filter and the infrared cut filter may be disposed on the infrared ray transmission filter.

A planarizing layer may be disposed between the filter layer and the infrared cut filter.

Subsequently, an image pick-up device (camera system) is described as an example to which the solid-state imaging device according to the invention is applied.

Figure 2:
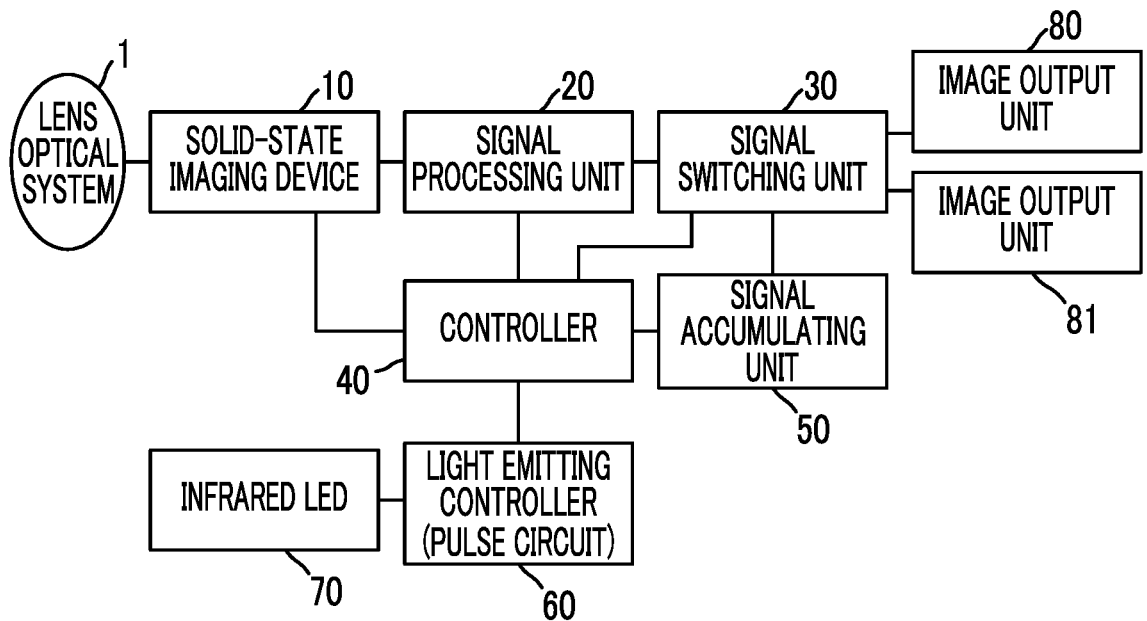
FIG. 2 is a functional block diagram of an image pick-up device to which the solid-state imaging device according to the invention is applied.

FIG. 2 is a functional block diagram of an image pick-up device. The image pick-up device comprises a lens optical system 1, a solid-state imaging device 10, a signal processing unit 20, a signal switching unit 30, a controller 40, a signal accumulating unit 50, a light emitting controller 60, an infrared LED 70 of a light emitting element that emitting infrared light, and image output units 80 and 81. As the solid-state imaging device 10, the solid-state imaging device 100 described above can be used. All or a portion of the configurations except for those of the solid-state imaging device 10 and the lens optical system 1 may be formed on the same semiconductor substrate. With respect to the respect configurations of the image pick-up device, paragraphs 0032 to 0036 of JP2011-233983A are referred to, and the contents thereof are incorporated to this specification.

As the image pick-up device, there exist a motion sensor, a proximity sensor, and a gesture sensor.

EXAMPLES

Hereinafter, examples according to the invention are described, but the invention is not limited to these examples at all. Unless particularly described otherwise, "parts" and "%" are on a mass basis.

<Preparing of Composition (Infrared Shielding Composition)>

Components presented in Table 1 below were dissolved in solvents presented in Table 1 so as to prepare infrared shielding compositions. The description "A/B" in Section "parts by mass" refers to parts by mass of respective components used in Table 1. For example, the "resin binder" of Example 21 means that a "resin A" and a "resin B" are respectively used by 14.7 parts by mass and 0.8 parts by mass.

TABLE 1

| | | Composition formula | | | | | | |
|---|---|---|---|---|---|---|---|---|
| | Item | Resin binder | Polymerizable compound | Polymerization initiator | Sensitizer | Solvent A (Boiling point (° C.)) | Solvent B1 (Boiling point (° C.)) | Solvent B2 (Boiling point (° C.)) |
| Example 1 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 2 | Type | Resin A | DPHA | IRGACURE 369 | DETX-S | Cyclohexanol acetate (173) | Butyl acetate (126) | PGMEA (145) |
| | Parts by mass | 15.7 | 6.4 | 1.5 | 0.5 | 3 | 2.4 | 52.6 |
| Example 3 | Type | Resin A | DPHA | IRGACURE 369 | DETX-S | Dipropylene glycol dimethyl ether (175) | Butyl acetate (126) | PGMEA (145) |
| | Parts by mass | 15.7 | 6.4 | 1.5 | 0.5 | 3 | 2.4 | 52.6 |
| Example 4 | Type | Resin A | DPHA | IRGACURE 369 | DETX-S | Ethylene glycol monobutyl ether acetate (188) | Butyl acetate (126) | PGMEA (145) |
| | Parts by mass | 15.7 | 6.4 | 1.5 | 0.5 | 3 | 2.4 | 52.6 |
| Example 5 | Type | Resin A | DPHA | IRGACURE 369 | DETX-S | Diethylene glycol diethyl ether (189) | Butyl acetate (126) | PGMEA (145) |
| | Parts by mass | 15.7 | 6.4 | 1.5 | 0.5 | 3 | 2.4 | 52.6 |
| Example 6 | Type | Resin A | DPHA | IRGACURE 369 | DETX-S | Diethylene glycol monomethyl ether (194) | Butyl acetate (126) | PGMEA (145) |
| | Parts by mass | 15.7 | 6.4 | 1.5 | 0.5 | 3 | 2.4 | 52.6 |
| Example 7 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 8 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |

TABLE 1-continued

| Example 9 | Type | Resin A | DPHA | IRGACURE 369 | DETX-S | Dipropylene glycol monomethyl ether (188) | Butyl acetate (126) | PGMEA (145) |
|---|---|---|---|---|---|---|---|---|
| | Parts by mass | 15.7 | 6.4 | 1.5 | 0.5 | 3 | 2.4 | 52.6 |
| Example 10 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 11 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 12 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 13 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 14 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 15 | Type | Resin A | DPHA | IRGACURE 369 | DETX-S | Dipropylene glycol monomethyl ether (188) | Butyl acetate (126) | PGMEA (145) |
| | Parts by mass | 13.2 | 7.5 | 1.8 | 0.6 | 5 | 3 | 51.8 |
| Example 16 | Type | Resin A | DPHA | IRGACURE 369 | DETX-S | Dipropylene glycol monomethyl ether (188) | Butyl acetate (126) | PGMEA (145) |
| | Parts by mass | 13.1 | 5.4 | 1.3 | 0.4 | 10 | 3 | 51.8 |
| Example 17 | Type | Resin A | DPHA | IRGACURE 369 | DETX-S | Dipropylene glycol monomethyl ether (188) | Ethylene glycol monomethyl ether (125) | PGMEA (145) |
| | Parts by mass | 13.2 | 7.5 | 1.8 | 0.6 | 5 | 3 | 51.8 |
| Example 18 | Type | Resin A | DPHA | IRGACURE 369 | DETX-S | Dipropylene glycol monomethyl ether (188) | 1,4-dioxane (101) | PGMEA (145) |
| | Parts by mass | 13.2 | 7.5 | 1.8 | 0.6 | 5 | 3 | 51.8 |
| Example 19 | Type | Resin A | DPHA | IRGACURE 369 | DETX-S | Dipropylene glycol monomethyl ether (188) | Butyl acetate (126) | PGMEA (145) |
| | Parts by mass | 13.1 | 5.4 | 1.3 | 0.4 | 3 | 11 | 50.8 |
| Example 20 | Type | Resin A | DPHA/ Monomer A | IRGACURE OXE02 | | Diethylene glycol monomethyl ether (194) | Butyl acetate (126) | PGMEA (145) |
| | Parts by mass | 15.7 | 6.4 (5/1.4) | 1.6 | | 3 | 1 | 54.3 |
| Example 21 | Type | Resin A/ Resin B | DPHA | IRGACURE OXE02 | | Dipropylene glycol monomethyl ether (188) | Butyl acetate (126) | PGMEA (145) |
| | Parts by mass | 15.5 (14.7/0.8) | 6.3 | 1.2 | | 3 | 3 | 53.9 |

TABLE 1-continued

| Example | | | | | | | | |
|---|---|---|---|---|---|---|---|---|
| Example 22 | Type | Resin A/ Resin C | DPHA | IRGACURE 369 | DETX-S | Dipropylene glycol monomethyl ether (188) | Butyl acetate (126) | PGMEA (145) |
| | Parts by mass | 15.7 (12/3.7) | 6.4 | 1.5 | 0.5 | 2 | 1 | 55 |
| Example 23 | Type | Resin A | DPHA/ Monomer B | IRGACURE 369 | DETX-S | Dipropylene glycol monomethyl ether (188) | Butyl acetate (126) | PGMEA (145) |
| | Parts by mass | 13.1 | 5.4 (3.0/2.4) | 1.3 | 0.4 | 0.7 | 0.7 | 63.4 |
| Example 24 | Type | Resin A | Trimethylol-propane triacrylate | IRGACURE 369 | DETX-S | Dipropylene glycol monomethyl ether (188)/ Diethylene glycol diethyl ether (189) | Butyl acetate (126) | PGMEA (145) |
| | Parts by mass | 15.7 | 6.4 | 1.5 | 0.5 | 1.5/1.5 | 2.4 | 52.6 |
| Example 25 | Type | Resin A | DPHA | IRGACURE 369 | DETX-S | Dipropylene glycol monomethyl ether (188) | Butyl acetate (126)/ 1,4-dioxane (101) | PGMEA (145) |
| | Parts by mass | 15.7 | 6.4 | 1.5 | 0.5 | 3 | 1.8/0.6 | 52.6 |
| Example 26 | Type | Resin A | DPHA/ Monomer B | IRGACURE 369 | DETX-S | Dipropylene glycol monomethyl ether (188) | Butyl acetate (126) | PGMEA (145)/ Ethyl lactate (155) |
| | Parts by mass | 15.7 | 6.4 (4.4/2.0) | 1.5 | 0.5 | 3 | 2.4 | 40/12.6 |
| Example 27 | Type | Resin A | DPHA | IRGACURE OXE02 | | Dipropylene glycol monomethyl ether (188) | Butyl acetate (126) | PGMEA (145) |
| | Parts by mass | 13.1 | 5.4 | 1 | | 0.8 | 0.8 | 63.9 |
| Example 28 | Type | Resin A/ Polyamic acid 1 | DPHA | IRGACURE 369 | DETX-S | Dipropylene glycol monomethyl ether (188) | Butyl acetate (126) | PGMEA (145) |
| | Parts by mass | 15.7 (11/4.7) | 6.4 | 1.5 | 0.5 | 2 | 1 | 55 |
| Example 29 | Type | Polyamic acid 2 | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 2 | 1 | 55 |
| Example 30 | Type | Resin D/ Poly-hydroxyamide | DPHA | IRGACURE 369 | DETX-S | Dipropylene glycol monomethyl ether (188) | Butyl acetate (126) | PGMEA (145) |
| | Parts by mass | 15.7 (12/3.7) | 6.4 | 1.5 | 0.5 | 2 | 1 | 55 |
| Example 31 | Type | Resin A/ Resin C | DPHA/ Monoacrylate MOI-BP | IRGACURE 369 | DETX-S | Dipropylene glycol monomethyl ether (188) | Butyl acetate (126) | PGMEA (145) |
| | Parts by mass | 15.7 (12/3.7) | 6.4 (5.5/0.9) | 1.5 | 0.5 | 2 | 1 | 55 |
| Example 32 | Type | Resin A | Monomer B | IRGACURE 369 | DETX-S | Dipropylene glycol monomethyl ether (188) | 1,4-dioxane (101) | PGMEA (145) |
| | Parts by mass | 15.7 | 6.4 | 1.5 | 0.5 | 1 | 0.8 | 56.2 |
| Example 33 | Type | Resin A | DPHA | IRGACURE 369 | DETX-S | Dipropylene glycol monomethyl ether (188) | 1,4-dioxane (101) | Ethyl lactate (155) |
| | Parts by mass | 13.2 | 7.5 | 1.8 | 0.6 | 5 | 3 | 51.8 |

TABLE 1-continued

| | | | | | | | | |
|---|---|---|---|---|---|---|---|---|
| Example 34 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Example 35 | Type | Resin A | DPHA | IRGACURE 369 | DETX-S | Dipropylene glycol monomethyl ether (188) | Butyl acetate (126) | PGMEA (145) |
| | Parts by mass | 15.7 | 6.4 | 1.5 | 0.5 | 3 | 2.4 | 52.6 |
| Comparative Example 1 | Type | Resin A | DPHA | IRGACURE 369 | DETX-S | | | PGMEA (145) |
| | Parts by mass | 15.7 | 6.4 | 1.5 | 0.5 | | | 58 |
| Comparative Example 2 | Type | Resin A | DPHA | IRGACURE 369 | DETX-S | Diethylene glycol dimethyl ether (162) | Butyl acetate (126) | PGMEA (145) |
| | Parts by mass | 13.1 | 5.4 | 1.3 | 0.4 | 22 | 0.7 | 42.1 |
| Comparative Example 3 | Type | Resin A | DPHA | IRGACURE OXE02 | | Triethylene glycol dimethyl ether (216) | Butyl acetate (126) | PGMEA (145) |
| | Parts by mass | 13.5 | 5.4 | 1.3 | | 22 | 0.7 | 42.1 |
| Comparative Example 4 | Type | Resin A | DPHA | IRGACURE 369 | DETX-S | Diethylene glycol dibutyl ether (256) | Butyl acetate (126) | PGMEA (145) |
| | Parts by mass | 15.7 | 6.4 | 1.5 | 0.5 | 3 | 1 | 54 |
| Comparative Example 5 | Type | Resin A | DPHA | IRGACURE 369 | DETX-S | Diethylene glycol dimethyl ether (162) | Butyl acetate (126) | PGMEA (145) |
| | Parts by mass | 15.7 | 6.4 | 1.5 | 0.5 | 3 | 2.4 | 52.6 |
| Comparative Example 6 | Type | Resin A | DPHA | IRGACURE 369 | DETX-S | EEP (166) | Butyl acetate (126) | PGMEA (145) |
| | Parts by mass | 15.7 | 6.4 | 1.5 | 0.5 | 3 | 2.4 | 52.6 |
| Comparative Example 7 | Type | Resin A | DPHA | IRGACURE 369 | DETX-S | Diacetone alcohol (168) | Butyl acetate (126) | PGMEA (145) |
| | Parts by mass | 15.7 | 6.4 | 1.5 | 0.5 | 3 | 2.4 | 52.6 |
| Comparative Example 8 | Type | Resin A | DPHA | IRGACURE 369 | DETX-S | γ-butyrolactone (204) | Butyl acetate (126) | PGMEA (145) |
| | Parts by mass | 15.7 | 6.4 | 1.5 | 0.5 | 3 | 2.4 | 52.6 |
| Comparative Example 9 | Type | Resin A | DPHA | IRGACURE 369 | DETX-S | Triethylene glycol dimethyl ether (216) | Butyl acetate (126) | PGMEA (145) |
| | Parts by mass | 15.7 | 6.4 | 1.5 | 0.5 | 3 | 2.4 | 52.6 |
| Comparative Example 10 | Type | Resin A | DPHA/ Trimethylolpropane triacrylate | IRGACURE 369 | DETX-S | Triethylene glycol dimethyl ether (216) | Butyl acetate/ PGME (126/120) | PGMEA (145) |
| | Parts by mass | 15.7 | 6.4 (4.4/2) | 1.5 | 0.5 | 3 | 10 (2.4/7.6) | 45 |

| | | Composition formula | | | Evaluation | | |
|---|---|---|---|---|---|---|---|
| | Item | Surfactant | UV absorbing agent | Tungsten oxide fine particles | Dispersing agent | Flat coating properties | Surface shape characteristics | Drying resistance |
| Example 1 | Type | Megaface F-781-F | UV absorbing agent A | $Cs_{0.33}WO_3$ | Dispersing agent | A | A | A |
| | Parts by mass | 0.06 | 0.3 | 11.8 | 5.7 | | | |

TABLE 1-continued

| | | | | | | | | |
|---|---|---|---|---|---|---|---|---|
| Example 2 | Type | Megaface F-781-F | UV absorbing agent A | $Cs_{0.33}WO_3$ | Dispersing agent | B | A | B |
| | Parts by mass | 0.06 | 0.3 | 11.8 | 5.7 | | | |
| Example 3 | Type | Megaface F-781-F | UV absorbing agent A | $Cs_{0.33}WO_3$ | Dispersing agent | B | A | B |
| | Parts by mass | 0.06 | 0.3 | 11.8 | 5.7 | | | |
| Example 4 | Type | Megaface F-781-F | UV absorbing agent A | $Cs_{0.33}WO_3$ | Dispersing agent | A | A | A |
| | Parts by mass | 0.06 | 0.3 | 11.8 | 5.7 | | | |
| Example 5 | Type | Megaface F-781-F | UV absorbing agent A | $Cs_{0.33}WO_3$ | Dispersing agent | A | A | A |
| | Parts by mass | 0.06 | 0.3 | 11.8 | 5.7 | | | |
| Example 6 | Type | Megaface F-781-F | UV absorbing agent A | $Cs_{0.33}WO_3$ | Dispersing agent | A | B | A |
| | Parts by mass | 0.06 | 0.3 | 11.8 | 5.7 | | | |
| Example 7 | Type | Megaface R-30 | UV absorbing agent A | $Cs_{0.33}WO_3$ | Dispersing agent | A | A | A |
| | Parts by mass | 0.07 | 0.3 | 11.8 | 5.7 | | | |
| Example 8 | Type | Megaface F-475 | UV absorbing agent A | $Cs_{0.33}WO_3$ | Dispersing agent | A | A | A |
| | Parts by mass | 0.05 | 0.3 | 11.8 | 5.7 | | | |
| Example 9 | Type | KF-6003 | UV absorbing agent A | $Cs_{0.33}WO_3$ | Dispersing agent | A | A | A |
| | Parts by mass | 0.05 | 0.3 | 11.8 | 5.7 | | | |
| Example 10 | Type | OLFINE E1010 | UV absorbing agent A | $Cs_{0.33}WO_3$ | Dispersing agent | A | A | A |
| | Parts by mass | 0.05 | 0.3 | 11.8 | 5.7 | | | |
| Example 11 | Type | polyfox PF656 | UV absorbing agent A | $Cs_{0.33}WO_3$ | Dispersing agent | A | A | A |
| | Parts by mass | 0.05 | 0.3 | 11.8 | 5.7 | | | |
| Example 12 | Type | polyfox PF6320 | UV absorbing agent A | $Cs_{0.33}WO_3$ | Dispersing agent | A | A | A |
| | Parts by mass | 0.02 | 0.3 | 11.8 | 5.7 | | | |
| Example 13 | Type | polyfox PF6520 | UV absorbing agent A | $Cs_{0.33}WO_3$ | Dispersing agent | A | A | A |
| | Parts by mass | 0.06 | 0.3 | 11.8 | 5.7 | | | |
| Example 14 | Type | polyfox PF6520 | UV absorbing agent A | $Cs_{0.33}WO_3$ | Dispersing agent | A | B | A |
| | Parts by mass | 0.09 | 0.3 | 11.8 | 5.7 | | | |
| Example 15 | Type | Megaface F-781-F | DPO | $Cs_{0.33}WO_3$ | Dispersing agent | A | A | A |
| | Parts by mass | 0.06 | 0.3 | 11.2 | 5.5 | | | |
| Example 16 | Type | Megaface F-781-F | DPO | $Cs_{0.33}WO_3$ | Dispersing agent | A | B | A |
| | Parts by mass | 0.06 | 0.3 | 9.8 | 4.8 | | | |
| Example 17 | Type | Megaface F-781-F | DPO | $Cs_{0.33}WO_3$ | Dispersing agent | A | A | A |
| | Parts by mass | 0.06 | 0.3 | 11.2 | 5.5 | | | |

TABLE 1-continued

| | | | | | | | | |
|---|---|---|---|---|---|---|---|---|
| Example 18 | Type | Megaface F-781-F | DPO | Cs$_{0.33}$WO$_3$ | Dispersing agent | A | A | B |
| | Parts by mass | 0.06 | 0.3 | 11.2 | 5.5 | | | |
| Example 19 | Type | Megaface F-781-F | DPO | Cs$_{0.33}$WO$_3$ | Dispersing agent | A | B | B |
| | Parts by mass | 0.06 | 0.3 | 9.8 | 4.8 | | | |
| Example 20 | Type | polyfox PF6520 | DPO | Cs$_{0.33}$WO$_3$ | Dispersing agent | A | B | A |
| | Parts by mass | 0.06 | 0.4 | 11.8 | 5.7 | | | |
| Example 21 | Type | polyfox PF6520 | DPO | Cs$_{0.33}$WO$_3$ | Dispersing agent | A | A | A |
| | Parts by mass | 0.06 | 0.3 | 11.2 | 5.5 | | | |
| Example 22 | Type | polyfox PF6520 | DPO | Cs$_{0.33}$WO$_3$ | Dispersing agent | A | A | A |
| | Parts by mass | 0.06 | 0.3 | 11.8 | 5.7 | | | |
| Example 23 | Type | polyfox PF6520 | DPO | Cs$_{0.33}$WO$_3$ | Dispersing agent | A | A | A |
| | Parts by mass | 0.06 | 0.3 | 9.8 | 4.8 | | | |
| Example 24 | Type | Megaface F-781-F | UV absorbing agent A | Cs$_{0.33}$WO$_3$ | Dispersing agent | A | A | A |
| | Parts by mass | 0.06 | 0.3 | 11.8 | 5.7 | | | |
| Example 25 | Type | Megaface F-781-F | UV absorbing agent A | Cs$_{0.33}$WO$_3$ | Dispersing agent | A | A | A |
| | Parts by mass | 0.06 | 0.3 | 11.8 | 5.7 | | | |
| Example 26 | Type | Megaface F-781-F | UV absorbing agent A | Cs$_{0.33}$WO$_3$ | Dispersing agent | A | A | A |
| | Parts by mass | 0.06 | 0.3 | 11.8 | 5.7 | | | |
| Example 27 | Type | polyfox PF656/ polyfox PF6520 | DPO | Cs$_{0.33}$WO$_3$ | Dispersing agent | A | A | A |
| | Parts by mass | 0.06 (0.03/0.03) | 0.3 | 9.8 | 4.8 | | | |
| Example 28 | Type | polyfox PF6520 | DPO | Cs$_{0.33}$WO$_3$ | Dispersing agent | A | A | A |
| | Parts by mass | 0.06 | 0.3 | 11.8 | 5.7 | | | |
| Example 29 | Type | polyfox PF6520 | DPO | Cs$_{0.33}$WO$_3$ | Dispersing agent | A | A | A |
| | Parts by mass | 0.06 | 0.3 | 11.8 | 5.7 | | | |
| Example 30 | Type | polyfox PF6520 | DPO | Cs$_{0.33}$WO$_3$ | Dispersing agent | A | A | A |
| | Parts by mass | 0.06 | 0.3 | 11.8 | 5.7 | | | |
| Example 31 | Type | Megaface F-475 | DPO | Cs$_{0.33}$WO$_3$ | Dispersing agent | A | A | A |
| | Parts by mass | 0.05 | 0.3 | 11.8 | 5.7 | | | |
| Example 32 | Type | Megaface F-475 | DPO | Cs$_{0.33}$WO$_3$ | Dispersing agent | A | A | B |
| | Parts by mass | 0.05 | 0.3 | 11.8 | 5.7 | | | |
| Example 33 | Type | Megaface F-781-F | DPO | Cs$_{0.33}$WO$_3$ | Dispersing agent | B | B | A |
| | | 0.06 | 0.3 | 11.2 | 5.5 | | | |
| Example 34 | Type | Megaface F-781-F | UV absorbing agent A | Cs$_{0.33}$WO$_3$/ IR-28 | Dispersing agent | A | A | A |
| | Parts by mass | 0.06 | 0.3 | 11.2/0.6 | 5.7 | | | |
| Example 35 | Type | Megaface F-781-F | UV absorbing agent A | Cs$_{0.33}$WO$_3$/ IR-81 5K | Dispersing agent | A | A | A |
| | Parts by mass | 0.06 | 0.3 | 11.2/0.6 | 5.7 | | | |

TABLE 1-continued

| | | | | | | | | |
|---|---|---|---|---|---|---|---|---|
| Comparative Example 1 | Type | polyfox PF6520 | DPO | $Cs_{0.33}WO_3$ | Dispersing agent | C | B | C |
| | Parts by mass | 0.06 | 0.3 | 11.8 | 5.7 | | | |
| Comparative Example 2 | Type | polyfox PF6520 | DPO | $Cs_{0.33}WO_3$ | Dispersing agent | C | B | C |
| | Parts by mass | 0.06 | 0.3 | 9.8 | 5.7 | | | |
| Comparative Example 3 | Type | polyfox PF6520 | DPO | $Cs_{0.33}WO_3$ | Dispersing agent | B | C | A |
| | Parts by mass | 0.06 | 0.3 | 9.8 | 4.8 | | | |
| Comparative Example 4 | Type | polyfox PF6520 | DPO | $Cs_{0.33}WO_3$ | Dispersing agent | A | C | A |
| | Parts by mass | 0.06 | 0.3 | 11.8 | 5.7 | | | |
| Comparative Example 5 | Type | Megaface F-781-F | UV absorbing agent A | $Cs_{0.33}WO_3$ | Dispersing agent | C | A | C |
| | Parts by mass | 0.06 | 0.3 | 11.8 | 5.7 | | | |
| Comparative Example 6 | Type | Megaface F-781-F | UV absorbing agent A | $Cs_{0.33}WO_3$ | Dispersing agent | C | A | C |
| | Parts by mass | 0.06 | 0.3 | 11.8 | 5.7 | | | |
| Comparative Example 7 | Type | Megaface E-781-F | UV absorbing agent A | $Cs_{0.33}WO_3$ | Dispersing agent | C | A | C |
| | Parts by mass | 0.06 | 0.3 | 11.8 | 5.7 | | | |
| Comparative Example 8 | Type | Megaface F-781-F | UV absorbing agent A | $Cs_{0.33}WO_3$ | Dispersing agent | A | C | A |
| | Parts by mass | 0.06 | 0.3 | 11.8 | 5.7 | | | |
| Comparative Example 9 | Type | Megaface F-781-E | UV absorbing agent A | $Cs_{0.33}WO_3$ | Dispersing agent | A | C | A |
| | Parts by mass | 0.06 | 0.3 | 11.8 | 5.7 | | | |
| Comparative Example 10 | Type | Megaface F-781-F | DPO | $Cs_{0.33}WO_3$ | Dispersing agent | A | C | A |
| | Parts by mass | 0.06 | 0.3 | 11.8 | 5.7 | | | |

Respective components used in Table 1 are collectively presented below.

(Resin Binder)

Resin A: ACRYCURE RD-F8 manufactured by Nippon Shokubai Co., Ltd.

Resin B: B-1050K manufactured by FUJIFILM Finechemicals Co., Ltd. (Table below)

Resin C: ACRYBASE FF-426 manufactured by Fujikura Kasei Co., Ltd. (Table below)

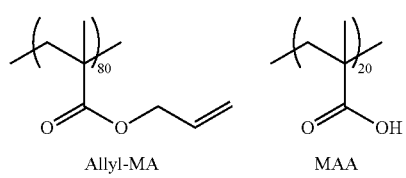

Allyl-MA    MAA

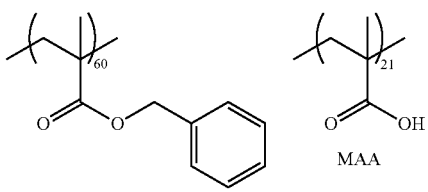

BzMA    MAA

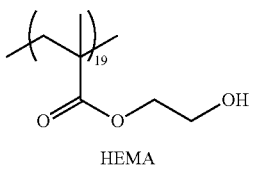

HEMA

Resin D: DB-1305 manufactured by Fujikura Kasei Co., Ltd. (Table below)

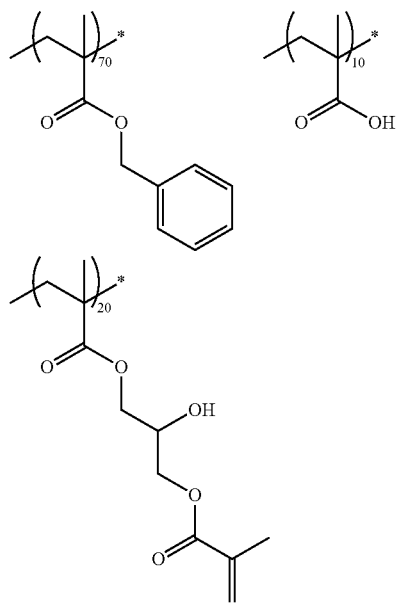

Polyamic Acid 1: Polyamic acid disclosed in Example 1 (Paragraph 0113) of JP2013-50593A Polyamic Acid 2: Polyamic acid disclosed in Example 2 (Paragraph 0118) of JP2013-50593A Polyhydroxyamide: Polyhydroxyamide obtained by method disclosed in paragraph 0106 of JP2007-199606A (Polymerizable Compound)

DPHA: KAYARAD DPHA (manufactured by Nippon Kayaku Co., Ltd.)

Monomer A: LIGHTACRYLATE DCP-A (manufactured by Kyoeisha Chemical Co., Ltd.)

Monomer B: ARONIX TO-756 (manufactured by Toagosei Co., Ltd.)

Trimethylol propane triacrylate: A-TMPT (manufactured by Shin-Nakamura Chemical Co., Ltd.)

Monoacrylate MOI-BP (manufactured by Showa Denko K.K.)

(Polymerization Initiator)

IRGACURE 369: IRGACURE 369 (manufactured by BASF SE)

IRGACURE OXE-02: IRGACURE OXE-02 (manufactured by BASF SE)

(Sensitizer)

DETX-S: Kayacure DETX-S (2,4-diethylthioxanthone) (manufactured by Shoji Sangyo Co., Ltd.)

(Solvent)

PGMEA: 1-methoxy-2-propanol acetate

PGME: 1-methoxy-2-propanol

EEP: Ethyl-3-ethoxypropionate (surfactant)

Megaface F-781-F (manufactured by DIC Corporation)

Megaface R-30 (manufactured by DIC Corporation)

Megaface F-475 (manufactured by DIC Corporation)

KF-6003 (manufactured by Shin-Etsu Chemical Co., Ltd.)

OLFINE E1010 (manufactured by Nisshin Chemical Co., Ltd.)

polyfox PF656 (manufactured by BASF SE)

polyfox PF6320 (manufactured by BASF SE)

polyfox PF6520 (manufactured by BASF SE)

(UV Absorbing Agent (Ultraviolet Absorbing Agent))

UV absorbing agent A: Compound below

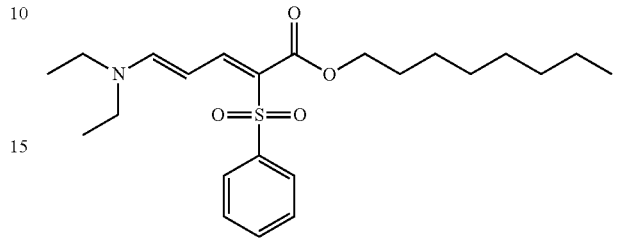

DPO: DPO (manufactured by FUJIFILM Finechemicals Co., Ltd.)

Tungsten oxide fine particles in Table 1 was supplied by using YMS-01A-2 (manufactured by Sumitomo Metal Mining Co., Ltd.) and a predetermined amount of a dispersing agent was included in YMS-01A-2.

Excolor IR-28 of Nippon Shokubai Co., Ltd. was used in Example 34 and Excolor 815K (the phthalocyanine-based pigment) was used in Example 35 together with tungsten oxide fine particles.

Various measurements below were performed by using the composition obtained above. The results were collectively presented in Table 1 above.

<Flat Coating Properties>

A silicon substrate of which a shape of an opening portion is a square (Length of one side: 5 µm) and on which four concave portions (Depth: 2.2 µm) were disposed in an interval of 5 µm in one direction was prepared, this silicon substrate was coated with compositions of respective examples and respective comparative examples, a drying treatment was performed for two minutes at 100° C., and light irradiation (Exposure amount: 500 mJ/cm$^2$) was performed by using an exposure device UX3100-SR (manufactured by Ushio Inc.), so as to form an infrared shielding layer (thickness: 2.7 µm).

In one direction in which concave portions of the silicon substrate were arranged, the surface of the infrared shielding layer disposed on the concave portions of the silicon substrate was measured with an atomic force microscope (AFM) (manufactured by Veeco Instruments Inc., D3100), a maximum height difference (nm) was obtained, and evaluation was performed in criteria below. In practice, "A" or "B" is desirable.

"A": A case where maximum height difference was within 200 nm

"B": A case where maximum height difference was greater than 200 nm and 400 nm or less "C": A case where maximum height difference was greater than 400 nm <Surface Shape Characteristics>

The silicon substrate was coated with compositions of respective examples and respective comparative examples, a drying treatment was performed for two minutes at 100° C., and light irradiation (Exposure amount: 500 mJ/cm$^2$) was performed via a photo mask (mask pattern: 50 µm line and space) by using an exposure device UX3100-SR (manufactured by Ushio Inc.). A pattern exposed coated film was subjected to puddle development at room temperature for 60 seconds, by using 60% aqueous solution of an organic alkaline developer CD-2000 (manufactured by manufactured by FUJIFILM Finechemicals Co., Ltd.), and rinse was performed with pure water by spin shower for 20 seconds. Thereafter, washing was further performed with pure water. Thereafter, water drops were blown with high pressure air, the substrate was air dried, and post baking was performed in a hot plate at 220° C. for 300 seconds, so as to form an infrared shielding layer (thickness: 2.7 µm) as a line portion.

Arbitrary five points on the surface of the obtained infrared shielding layer were measured with an optical microscope (magnification: 200 times) and were evaluated by criteria below. In practice, "A" or "B" is desirable.

"A": A case where no annular patterns were checked in any portions.

"B": A case where no annular patterns were checked in any portions, but the surface was slightly rough.

"C": A case where annular patterns were checked in some portions, or a case where prominent coating unevenness (linear patterns in a wide range, optical unevenness) was checked on the surface.

<Drying Resistance>

10 mL of the compositions disclosed in the examples and comparative examples were put into a 100 mL disco cup and were left alone at room temperature for one day.

A case where a liquid surface was not changed was evaluated as "A", a case where solid matters were slightly seen in an edge portion of a liquid surface but a film was not formed was evaluated as "B", and a case where a film was formed on a liquid upper portion by drying was evaluated as "C". In practice, "A" or "B" is desirable.

Infrared cut filters formed by using the compositions of the examples had maximum transmittance of 60% or greater at 400 nm to 1,300 nm and had maximum transmittance of 20% or less at 900 to 1,300 nm.

As a method of manufacturing the infrared cut filter, the infrared cut filter was manufactured by coating the glass substrate with the compositions of the respective examples and the respective comparative examples, a dry treatment was performed for two minutes at 100° C., light irradiation (Exposure amount: 1,000 mJ/cm$^2$) was performed by using an exposure device UX3100-SR (manufactured by Ushio Inc.).

As illustrated in Table 1, in a case where the infrared shielding composition according to the invention was used, flat coating properties, surface shape characteristics, and drying resistance were excellent.

According to the comparison of Examples 1 to 6, it was checked that, in a case where a boiling point of the solvent A was 180° C. to 193° C., more excellent effects were able to be obtained.

According to the comparison of Examples 12 to 14, it was checked that in a case where the content of the surfactant was 0.001 to 0.070 mass % with respect to the total mass of the infrared shielding composition, more excellent effects were able to be obtained.

According to the comparison of Examples 17 and 18, it was checked that in a case where a boiling point of the solvent B1 was 120° C. to 130° C., more excellent effects were able to be obtained.

According to the comparison of Examples 18 and 19, it was checked that in a case where a mass ratio of the solvent B1 and the solvent B2 (a mass of the solvent B1/a mass of the solvent B2) was 0.010 to 0.200, more excellent effects were able to be obtained.

Meanwhile, in the compositions disclosed in comparative examples in which the predetermined solvent A was not used, desired effects were not able to be obtained.

EXPLANATION OF REFERENCES

1: lens optical system
10: solid-state imaging device
20: signal processing unit
30: signal switching unit
40: controller
50: signal accumulating unit
60: light emitting controller
70: infrared LED
80, 81: image output units
100: solid-state imaging device
110: solid-state imaging device substrate
111: infrared cut filter
112: color filter
113: infrared ray transmission filter
114: areas
115: microlens
116: planarizing layer
hv: incidence ray

What is claimed is:

1. An infrared shielding composition, comprising at least:
   metal containing tungsten oxide particles;
   a resin binder;
   a solvent A of which a boiling point is 170° C. to 200° C. at 1 atm;
   a solvent B different from the solvent A; and
   a surfactant,
   wherein the solvent B includes a solvent B1 of which a boiling point is 100° C. to 130° C. at 1 atm, and a solvent B2 of which a boiling point is greater than 130° C. and less than 170° C. at 1 atm;
   wherein a mass ratio of the solvent B1 and the solvent B2 is 0.010 to 0.200, and
   the mass ratio represents a mass of a solvent B1/a mass of a solvent B2;
   wherein a content of the solvent A is 0.7 to 5.0 mass % with respect to a total mass of the infrared shielding composition; and
   wherein a content of the surfactant is 0.001 to 0.070 mass % with respect to a total mass of the infrared shielding composition.

2. The infrared shielding composition according to claim 1,
   wherein a boiling point of the solvent A is 180° C. to 193° C.

3. The infrared shielding composition according to claim 1,
   wherein the solvent A includes three or more oxygen atoms in a molecule.

4. The infrared shielding composition according to claim 1,
   wherein the solvent A includes dipropylene glycol monomethyl ether.

5. The infrared shielding composition according to claim 1,
   wherein a boiling point of the solvent B1 is 120° C. to 130° C. at 1 atm.

6. The infrared shielding composition according to claim 1,
   wherein the solvent B1 includes butyl acetate.

7. The infrared shielding composition according to claim further comprising:
at least one selected from the group consisting of a polymerizable compound, a polymerization initiator, and an ultraviolet absorbing agent.

8. The infrared shielding composition according to claim 7,
wherein the polymerization initiator includes an oxime compound or an α-amino ketone compound.

9. The infrared shielding composition according to claim 1,
wherein the resin binder includes an alkali-soluble binder.

10. The infrared shielding composition according to claim 9,
wherein the alkali-soluble binder has an acid group.

11. The infrared shielding composition according to claim 9,
wherein the alkali-soluble binder has a polymerizable group.

12. An infrared cut filter formed by using the infrared shielding composition according to claim 1.

13. The infrared cut filter according to claim 12,
wherein maximum transmittance at 400 nm to 1,300 nm is 60% or greater, and
maximum transmittance at 900 to 1,300 nm is 20% or less.

14. A solid-state imaging device comprising:
the infrared cut filter according to claim 12.

15. A solid-state imaging device, comprising:
a filter layer including at least one selected from the group consisting of a color filter transmitting light in a red wavelength range, a color filter transmitting light in a green wavelength range, a color filter transmitting light in a blue wavelength range; and a color filter transmitting infrared light; and
the infrared cut filter according to claim 12 disposed on a light incident side of the filter layer.

16. The infrared shielding composition according to claim 1,
wherein the solvent A includes dipropylene glycol monomethyl ether, and wherein,
the solvent B1 includes butyl acetate.

17. The infrared shielding composition according to claim 1,
wherein the solvent A includes dipropylene glycol monomethyl ether, and wherein,
the solvent 131 includes butyl acetate and 1-methoxy-2-propanol acetate.

18. The infrared shielding composition according to claim 1,
wherein the resin binder has an allyl group.

* * * * *